United States Patent
Naka et al.

[11] Patent Number: 5,935,331
[45] Date of Patent: *Aug. 10, 1999

[54] APPARATUS AND METHOD FOR FORMING FILMS

[75] Inventors: Hiroyuki Naka, Osaka; Masayoshi Miura; Hiroshi Ogura, both of Kawasaki; Naoko Matsuda, Hirakata, all of Japan

[73] Assignee: Matsushita Electric Industrial Co., Ltd., Kadoma, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/524,823

[22] Filed: Sep. 7, 1995

[30] Foreign Application Priority Data

| Sep. 9, 1994 | [JP] | Japan | 6-215954 |
| Jan. 27, 1995 | [JP] | Japan | 7-011729 |
| Jul. 3, 1995 | [JP] | Japan | 7-167214 |

[51] Int. Cl.$^6$ ..................................................... B05C 11/02
[52] U.S. Cl. ............................ 118/319; 118/52; 118/696; 118/63
[58] Field of Search ............................ 118/52, 319, 320, 118/321, 323, 313, 315, 600, 62, 63, 706, 669, 696, 627, 629; 239/708, 706, 707, 695, 696, 550, 557, 566; 347/21, 8, 5, 12, 13

[56] References Cited

U.S. PATENT DOCUMENTS

| 4,313,968 | 2/1982 | Sickles et al. | 427/27 |
| 4,451,507 | 5/1984 | Beltz et al. | 118/320 |
| 4,564,280 | 1/1986 | Fukuda | 118/321 |
| 4,764,780 | 8/1988 | Yamamori et al. | 347/21 |
| 4,769,658 | 9/1988 | Oda et al. | 347/21 |
| 4,895,098 | 1/1990 | Akagawa et al. | 118/320 |
| 5,173,121 | 12/1992 | Hawk et al. | 118/629 |
| 5,238,878 | 8/1993 | Shinohara | 427/240 |
| 5,468,076 | 11/1995 | Hirano et al. | 347/8 |

FOREIGN PATENT DOCUMENTS 5-104052  4/1993  Japan .

*Primary Examiner*—David A. Simmons
*Assistant Examiner*—Calvin Padgett
*Attorney, Agent, or Firm*—Wenderoth, Lind & Ponack, L.L.P.

[57] ABSTRACT

An apparatus, for forming a film, includes an ink jet head having a plurality of nozzles for discharging a liquid, a rotating device for rotating about a rotary axis a coating-object substrate onto which liquid discharged from the ink jet head is deposited, a relatively moving device for moving the ink jet head and the coating-object substrate relatively to each other between a nearby region of the coating-object substrate near the rotary axis and a separate region of the coating-object substrate separate from the rotary axis, and a relative movement control device for controlling the relatively moving device so that an angular velocity of rotation by the rotating device is reduced responsively as a relative position of the ink jet head and the coating-object substrate therebetween makes relative movement from the nearby region toward the separate region, and an angular velocity of rotation by the rotating device is reduced responsively as the relative position of the ink jet head and the coating-object substrate therebetween moves relatively from the nearby region toward the separate region.

6 Claims, 16 Drawing Sheets

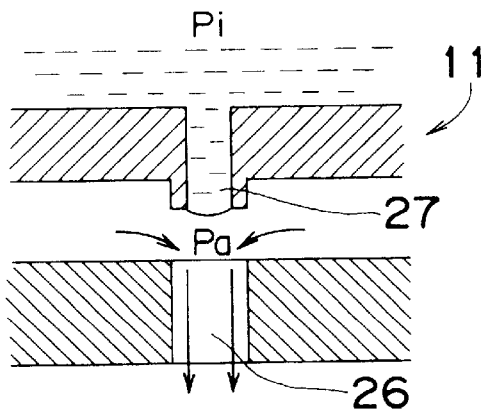
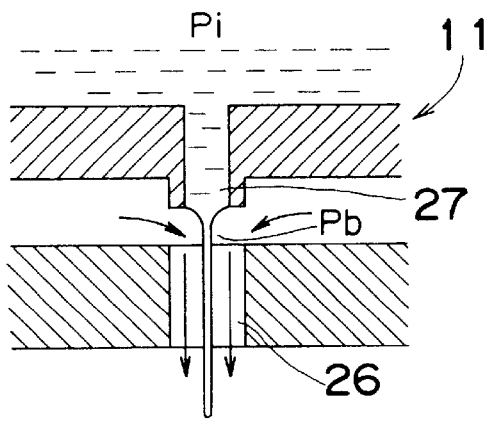
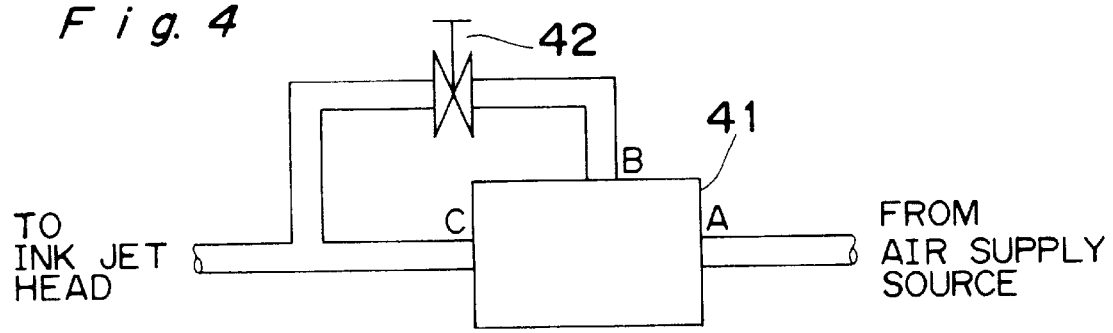
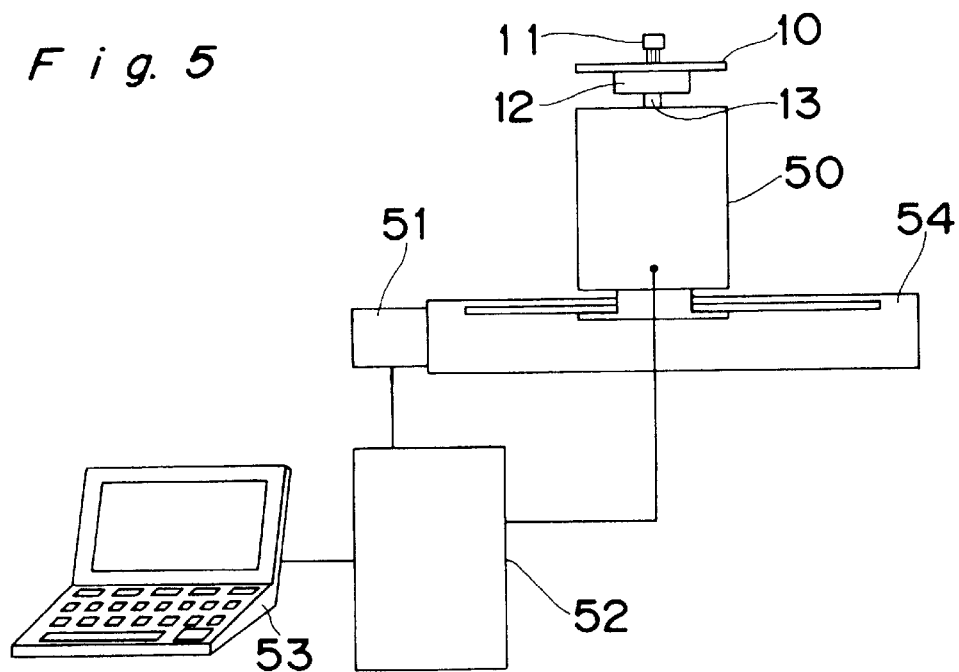

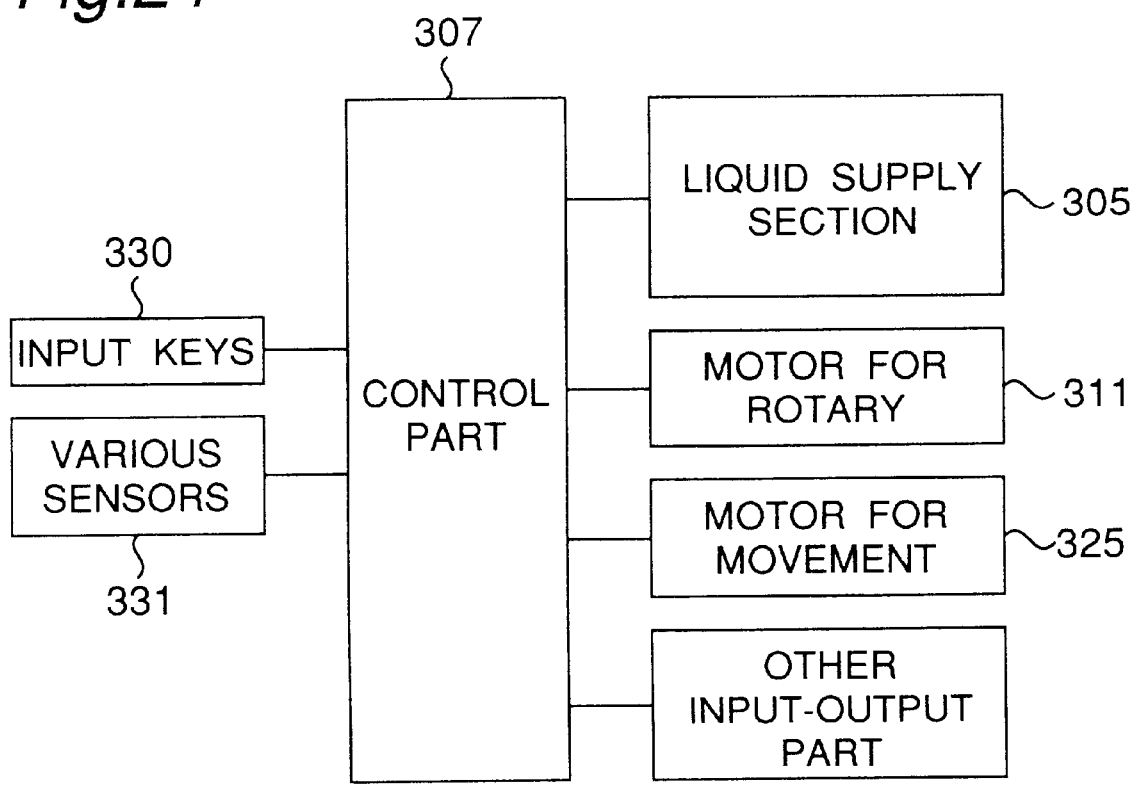

APPARATUS AND METHOD FOR FORMING FILMS

BACKGROUND OF THE INVENTION

The present invention relates to an apparatus and method for forming films and, more particularly, to an apparatus and method for forming a thin film (with film thickness 100 μm or less in wider sense, 10 μm or less in general) on a substrate or the like by discharging a solution-state substance through micro-nozzles. The invention can be applied, for example, to thin film formation processes suited to the fabrication of hybrid IC circuits, semiconductor circuits, or micromachines.

In recent years, the thin film formation technique has been applied to a variety of fields. The actual system for film formation has also been discussed over a wide range including spin coating, printing, and die coating, other than those which need vacuum equipment such as sputtering and deposition systems.

Among these, in particular, the spin coating system is often used for the resist coating, protective film formation, and the like in semiconductor processes.

Here is an explanation of a conventional spin coater.

FIGS. 20A, 20B, and 20C illustrate the construction and operation of a common conventional spin coater.

In FIGS. 20A, 20B, and 20C, there are shown a spindle 101 of the spin coater, a sample fixing base 102, a nozzle 103 for discharging coating liquid, a substrate 104 on which a thin film is to be formed, liquid 105 and 106, a thin film 107, and spattered droplets 108.

With such an arrangement, as shown in FIG. 20A, the liquid 105 is first discharged from the nozzle 103 toward the substrate 104 so as to be placed on the substrate 104.

Next, as shown in FIG. 20B, the spin coater is rotated at a low speed $\omega_1$, so that the liquid 106 is spread on the substrate 104.

Then, as shown in FIG. 20C, the spin coater is further rotated at a higher speed $\omega_2$, so that the thin film 107 is formed on the substrate 104.

However, with the above conventional arrangement, there would occur spattered droplets 108 that are dissipated in vain, as shown in FIG. 20C, such that 80 to 90% of the liquid would be discarded.

The reason of this is that the substrate 104 would be left partly uncoated at portions of poor compatibility with the liquid 105 unless the liquid 105 is discharged in large amounts.

As seen above, the conventional spin coater is poor at use efficiency of the liquid, and has had an issue that most of the coating liquid would be wasted.

Also, when a spin coater is used to form a film, the liquid flows from inside toward the outer periphery so that the outer peripheral portion becomes large in film thickness. This would causes distortion of the disk itself.

On the other hand, conventionally, as printing equipment, there have been energetically developed liquid dispensers using a micro-nozzle to discharge ink. As an application of such liquid dispensers, there have been developed in recent years liquid dispensers or circuit forming methods which use solutions other than ink, for example, resist, as the solution to be discharged, with a view to applying them to the fabrication of IC circuits and the like.

Now the prior art is described below by taking the liquid substance coating device of Japanese Laid-Open Patent Publication No. 5-104052 as an example.

FIG. 21 shows the construction as disclosed in Japanese Laid-Open Patent Publication No. 5-104052.

In FIG. 21, there are shown a liquid substance feed part 201, a discharge head 202 connected to the liquid substance feed part 201, a member to be coated 203 (hereinafter, referred to as substrate), an X-Y stage 204 for positioning the discharge head 202 and the substrate 203 so that they are opposed to each other.

The discharge head 202 comprises a pressure chamber 206 which communicates with the liquid substance feed part 201 and into which a liquid substance 205 is filled, a nozzle 207 provided at a longitudinally intermediate point of the pressure chamber 206 and opened to a lower end face of the discharge head 202, a displacement amplifying chamber 209 to which a displacement is given by a piezoelectric device 208 and which amplifies the displacement, and a diaphragm 210 provided at the boundary between the pressure chamber 206 and the displacement amplifying chamber 209.

Then, the piezoelectric device 208 is driven by a control part 211, and a displacement thereby generated is transferred through the displacement amplifying chamber 209 and the diaphragm 210 to the liquid substance 205 within the pressure chamber 206. As a result, the liquid substance 205 within the pressure chamber 206 is pressurized, so that the liquid substance 205 is spattered downward from the nozzle 207 in the form of liquid droplets 205a.

Adopting such a constitution makes it possible to spatter the liquid substance 205 contained in the nozzle 207 onto the substrate 203 in the form of liquid droplets 205a, and thereby to apply the liquid substance 205 on the substrate 203 in any given pattern.

It is noted that the X-Y stage 204 is controlled to a desired position by the control part 211.

Meanwhile, in the above-described conventional constitution, since the piezoelectric effect is primarily utilized as the method of discharge, there are some issues to be overcome as described below.

In the discharge method of the pressure-applying system using the piezoelectric effect (hereinafter, referred to as piezoelectric system), the solution to be discharged is formed into discharge droplets having diameters two to three times larger than the nozzle diameter. This poses restrictions on the miniaturization and precision of circuit patterns to be formed by the discharge liquid.

Next, in order to enhance the miniaturization and precision of circuit patterns, it is necessary to reduce the nozzle diameter. However, the more the nozzle diameter is reduced, the larger adhesion loss at the nozzle portion the piezoelectric system discharge method involves. Thus, there are limitations in reducing the nozzle diameter, especially in the case of high viscosity solutions.

Further, in the piezoelectric system discharge method, if some organic solution with a large amount of dissolved air is used as the discharge solution, there would occur the cavitation phenomenon, resulting in unstable discharge. Therefore, the kinds of solutions that can be discharged would be limited to a small extent.

SUMMARY OF THE INVENTION

An object of the present invention is therefore to provide an apparatus and method for forming films, which offers high efficiency of use of the coating liquid by introducing a novel liquid discharge head.

In accomplishing these and other aspects, according to a first aspect of the present invention, there is provided an apparatus for forming a film, comprising:

an ink jet head having a plurality of nozzles for discharging a liquid;

a rotating means for rotating about a rotary axis a coating-object substrate onto which the liquid discharged from the ink jet head is deposited;

a relatively moving means for moving the ink jet head and the coating-object substrate relatively to each other between a nearby region of the coating-object substrate near the rotary axis and a separate region of the coating-object object substrate separate from the rotary axis; and a relative movement control means for controlling the relatively moving means so that a velocity of the relative movement by the relatively moving means is reduced responsively as a relative position of the ink jet head and the coating-object substrate therebetween makes relative movement from the nearby region toward the separate region.

According to a second aspect of the present invention, there is provided an apparatus for forming a film, comprising:

an ink jet head having a plurality of nozzles for discharging a liquid;

a rotating means for rotating about a rotary axis a coating-object substrate onto which the liquid discharged from the ink jet head is deposited;

a relatively moving means for moving the ink jet head and the coating-object substrate relatively to each other between a nearby region of the coating-object substrate near the rotary axis and a separate region of the coating-object substrate separate from the rotary axis; and a relative movement control means for controlling the relatively moving means so that an angular velocity of rotation by the rotating means is reduced responsively as a relative position of the ink jet head and the coating-object substrate therebetween makes relative movement from the nearby region toward the separate region.

According to a third aspect of the present invention, there is provided the apparatus for forming a film, in the first aspect of the present invention, wherein the relative movement control means controls the relatively moving means so that an angular velocity of rotation by the rotating means is reduced responsively as the relative position of the ink jet head and the coating-object substrate therebetween makes relative movement from the nearby region toward the separate region.

According to a fourth aspect of the present invention, there is provided a method for forming a film, comprising steps of:

rotating about a rotary axis a coating-object substrate onto which a liquid discharged from a liquid discharge member having a plurality of nozzles for discharging the liquid is deposited; and moving the liquid discharge member and the coating-object substrate relatively to each other between a nearby region of the coating-object substrate near the rotary axis and a separate region of the coating-object substrate separate from the rotary axis in such a way that the more the relative movement progresses from the nearby region toward the separate region, the more a relative movement velocity is reduced.

According to a fifth aspect of the present invention, there is provided a method for forming a film, comprising steps of:

rotating about a rotary axis a coating-object substrate onto which a liquid discharged from a liquid discharge member having a plurality of nozzles for discharging the liquid is deposited; and moving the liquid discharge member and the coating-object substrate relatively to each other between a nearby region of the coating-object substrate near the rotary axis and a separate region of the coating-object substrate separate from the rotary axis in such a way that the more the relative movement progresses from the nearby region toward the separate region, the more an angular velocity of rotation of the coating-object substrate is reduced.

According to a sixth aspect of the present invention, there is provided the method for forming a film, in the fourth aspect of the present invention, wherein in the moving step, the more an angular velocity of rotation of the coating-object substrate is reduced.

According to a seventh aspect of the present invention, there is provided a method for forming a film comprising:

a coating step of rotating both an ink jet head having a plurality of liquid discharge nozzles for discharging a liquid and a substrate onto which the liquid is deposited at a first relative speed sufficient for the liquid to be deposited onto a surface of the substrate, so that the liquid is applied generally uniformly onto a generally entirety of the surface of the substrate, whereby a first coating state is accomplished; and a step of, after the coating step, rotating both the ink jet head and the substrate at a second relative speed higher than the first relative speed so that a coating liquid that has been excessively coated is spattered from the first coating state, whereby a film that has attained a second coating state more uniform than the first coating state is formed on the substrate.

According to an eighth aspect of the present invention, there is provided the apparatus for forming a film, in the first aspect of the present invention, wherein the ink jet head has a plurality of discharge parts which are constructed by the nozzles and are arrayed in one direction in such a way that a discharge amount of the liquid gradually increases toward the one direction, where a discharge part of a minimum discharge amount is disposed on a side of the nearby region of the substrate.

BRIEF DESCRIPTION OF THE DRAWINGS

These and other aspects and features of the present invention will become clear from the following description taken in conjunction with the preferred embodiments thereof with reference to the accompanying drawings, in which:

FIGS. 3A and 3B are sectional views of the nozzle of the ink jet head of the thin film forming apparatus;

FIG. 4 is a schematic view of a pressure adjusting mechanism of the ink jet head of the thin film forming apparatus;

FIG. 5 is a view of the overall thin film forming apparatus;

FIG. 24 is a block diagram showing the construction of a control part of the film forming apparatus shown in FIG. 22;

DETAILED DESCRIPTION OF THE PREFERRED EMBODIMENTS

Figure 1:
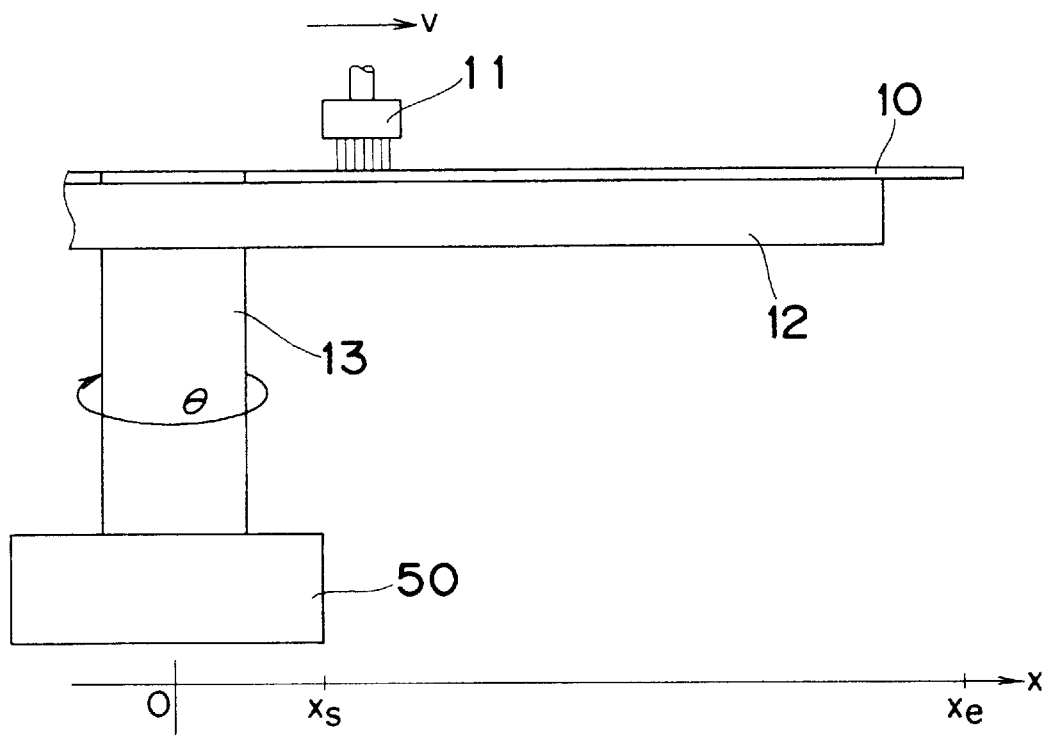
FIG. 1 is a view of a thin film forming apparatus according to a first embodiment of the present invention.

Before the description of the present invention proceeds, it is to be noted that like parts are designated by like reference numerals throughout the accompanying drawings.
(Embodiment 1)

FIG. 1 is a schematic view of the spin coater in the first embodiment of the present invention.

In FIG. 1, there are shown a disc-shaped substrate 10 as a coating-object to be coated, an ink jet head 11, a mounting base 12 for the coating-object substrate 10, a spindle 13 of the mounting base 12, and a motor 50 as an example of rotating means.

The ink jet head here refers to one in which liquid is discharged through a micro-nozzle (generally, with nozzle diameter 0.2 or 0.1 mm or less), where the discharge state of the liquid is controlled by an electrical signal so that the liquid is deposited onto a recording medium to be recorded.

In the present embodiment, the ink jet head has a plurality of such micro-nozzles and, more specifically, 48 nozzles are arranged radially of the coating-object substrate 10 at a pitch of 10 nozzles per mm. An example of the arrangement of the aforementioned micro-nozzles is such that 50 nozzles with bore diameter not more than 200 $\mu$m, for example, 50–60 $\mu$m are arranged at a pitch of 0.5 mm.

Discharge nozzles conventionally used for spin coaters are those with inside diameter 0.5 to 1 mm, having difficulty in controlling a minute amount of discharge. However, like the present embodiment, using an ink jet head as defined above makes it possible to draw fine patterns as well as to form a uniform, very thin film.

In the present embodiment, first, as shown in FIG. 1, while the coating-object substrate 10 is being rotated at an angular velocity θ, the ink jet head 11 is relatively moved at a velocity v radially of the coating-object substrate 10, in which movement the coating liquid is discharged through the nozzles so that the coating liquid is deposited on the coating-object substrate 10.

Then, over one turn of the coating-object substrate 10, 48 coated lines are created at intervals of 100 $\mu$m by the ink jet head 11, that is, a stripe of a 4.8 mm width is resultantly drawn.

Further, in this case, if the width of the lines has been properly selected, adjacent lines are connected to each other so that a thin film of a specified thickness is formed.

Accordingly, if such proper conditions are found and if the travel of the ink jet head 11 dependent on the relative movement velocity v over one turn of the coating-object substrate 10 is set to 4.8 mm, then it becomes possible to form a thin film at a so-called spiral one-stroke write.

Further, it is also possible to form a thin film by many times of overwrite, other than such a one-stroke write as mentioned above.

More specifically, depending on the settings of the relative movement velocity v of the ink jet head 11 and the angular velocity θ of the coating-object substrate 10, it is possible to form a thin film by rotating the coating-object substrate 10 to thereby accomplish the overwrite, while the ink jet head 11 is relatively moved to a specified amount, for example, 4.8 mm. This allows lines to be drawn in a fineness and density more than 10 lines per mm, thus suitable for forming thinner films with reliability.

In more detail, referring to FIG. 1, if the center of rotation of the coating-object substrate 10 is assumed as an origin O and the radial distance is x, then the coating-object substrate 10 rotates at an angular velocity θ and the ink jet head 11, while traveling at a velocity v in the radial direction (x-direction) of the coating-object substrate 10, starts discharge at a position $x_s$, and stops the discharge at an outer peripheral position $x_e$ of the coating-object substrate 10. Thus, the thin film formation is completed.

In this operation, in order to form a thin film equal in thickness over the entire range of the coating-object substrate 10, it is necessary to satisfy the following Equation (1) when the amount of discharge from the ink jet head 11 is a constant value Q:

$$v = k_1/x \qquad \text{Equation (1)}$$

(where $k_1$ is a constant and $k_1 > 0$)

Also, in order for lines to be drawn at the same resolution over the entire range of the coating-object substrate 10, it is necessary to satisfy the following Equation (2):

$$\theta = k_2/x \qquad \text{Equation (2)}$$

(where $k_2$ is a constant and $k_2 > 0$)

Therefore, since a disc-shaped substrate increases in coating area at outer places rather than at central places, the velocity v needs to be reduced increasingly with growing distance from central places toward outer places. Also, since the peripheral speed is higher at the outer places than at the central places with the number of revolutions constant, the number of revolutions also needs to be reduced with an increasing value of x in order that the peripheral speed of the ink jet head at recording positions is constant.

For example, with both v and θ constant, since the peripheral speed is lower at the central portions, the coating lines would be thicker at the central portions even with the same density of the lines, such that the resulting film would be thicker at the central portions and thinner at the outer peripheral portions. Moreover, there are some cases where outer peripheral lines do not overlap but remain in the form of lines.

If θ is kept constant with Equation (1) satisfied, the amount of coating will be constant over the entire range of the coating-object substrate. However, the central portions are coated with thicker, lower-density lines because of low peripheral speed, while the outer peripheral portions are coated with thinner, high-density lines. Thus, whereas the outer peripheral portions have well overlapped coating lines so that a uniform film is formed, the center portions have poorly overlapped lines so that nonuniformity in coating may take place.

As seen in these examples, in order to form a thin film, which is uniform over the entire range of the coating-object substrate and constant in thickness, it is desirable to satisfy at least one of Equations (1) and (2), and more preferably to satisfy both Equations.

Figure 2:
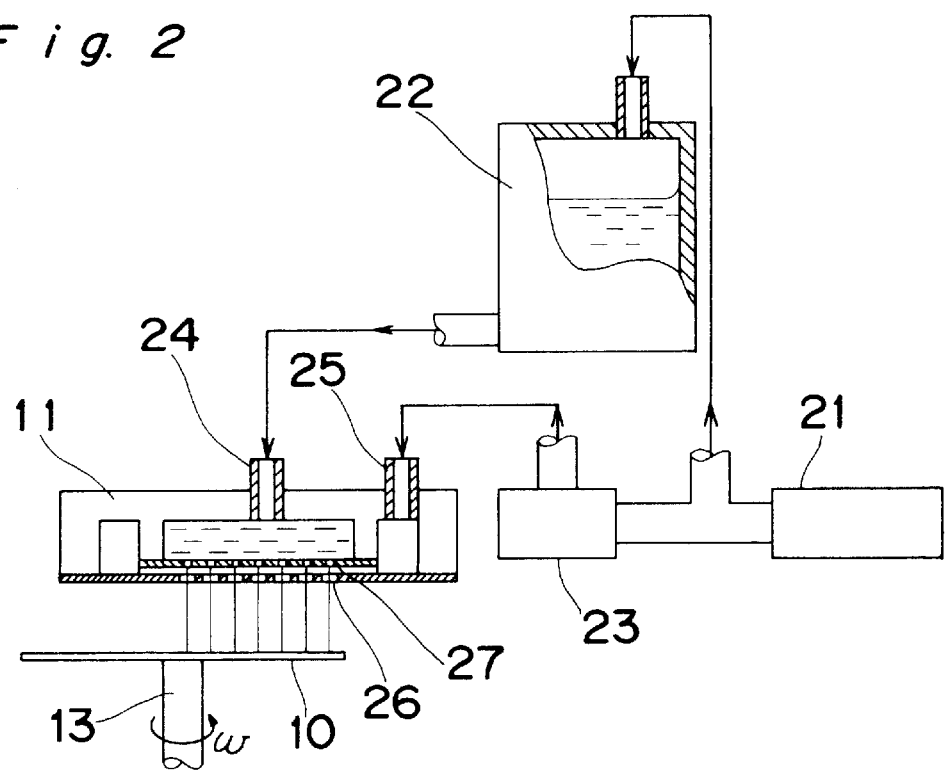
FIG. 2 is a sectional view of the ink jet head of the thin film forming apparatus.

Next, FIG. 2 is a schematic view showing a typical arrangement of the ink jet head according to the present embodiment.

In FIG. 2, there are shown an ink jet head 11, an air supply source 21, a liquid reservoir 22, a pressure adjustment mechanism 23 for adjusting the flow rate of air to be fed to the head 11, a liquid inlet port 24, an air inlet port 25, air discharge ports 26, and liquid discharge ports 27.

In this case, the liquid discharge ports 27 and the air discharge ports 26 are provided concentrically on the ink jet head 11.

Referring to the ink jet head 11, an air flow is fed thereinto through the air inlet port 25 from the air supply source 21 via the pressure adjustment mechanism 23, and an air flow of a constant flow rate is blown out through the air discharge port 26.

Meanwhile, from the liquid reservoir 22, coating liquid is fed via the liquid inlet port 24.

The air supply source 21 is connected also to the liquid reservoir 22. A pressure is applied to the liquid within the ink jet head 11, and balanced with air pressure generated in the vicinity of the liquid discharge port 27 by the air flow. Thus, the coating liquid is held at the liquid discharge port 27.

Next, FIGS. 3A and 3B are enlarged views of the nozzle portion of FIG. 2.

As shown by FIG. 3A, the air discharge ports 26 and the liquid discharge ports 27 are arranged concentrically, where an air flow of a constant flow rate is blown out from the air discharge port 26. With the air flow blown out, a pressure $P_a$ developed by the air flow is generated at the exit of the liquid discharge port 27.

Meanwhile, since air pressure is applied to the liquid reservoir 22, the liquid within the liquid discharge ports 27 has a pressure $P_i$ developed thereto.

Then, based on a nearly equally held balance between $P_a$ and $P_i$, the coating liquid is maintained to a stable meniscus at the liquid discharge port 27, so that the coating liquid is retained at the liquid discharge port 27.

On the other hand, as shown in FIG. 3B, when the air flow fed to the ink jet head 11 is reduced in amount by the pressure adjustment mechanism 23, the pressure developed at the exit of the liquid discharge port 27 becomes $P_b$, which is smaller than $P_a$, so that the meniscus collapses due to a pressure difference $(P_i - P_b)$, causing the coating liquid to be discharged out. Meanwhile, air is still flowing out through the air discharge port 26. As a result, the discharged liquid is enveloped in this air flow so as to be passed through the air discharge port 26 and discharged outward.

Next, FIG. 4 shows a typical example of the arrangement of the pressure adjustment mechanism 23.

Referring to FIG. 4, the air flow derived from the air supply source flows into an entrance A of a solenoid valve 41, and flows out through an outlet port B or C depending on the solenoid valve 41.

It is noted that the solenoid valve 41 switches the outlet port to B or C by an electrical signal.

It is arranged that when the inlet port A is communicated with the outlet port C, the pressure $P_i$ of the liquid reservoir and the pressure Pa due to the air flow become nearly equal to each other in the state of FIG. 3A.

Then, when a discharge signal is fed to the solenoid valve 41, the flow passage is switched from C to B.

As shown in FIG. 4, a flow passage resistor 42 involving a large pressure loss in the flow passage, such as a throttle valve, is connected to the outlet port B. By the air passing through the flow passage resistor 42, there occurs a pressure loss, so that the pressure due to the air flow at the ink jet head lowers from $P_a$ to $P_b$, resulting in the state of FIG. 3B, where the coating liquid is discharged out.

Now described below is a concrete example in which the coating liquid is actually discharged and applied onto the coating-object substrate by using the ink jet head having the above-described constitution.

In the present example, a phase-change type (photo-crystallization type) optical disk made of polycarbonate was used as the coating-object substrate, and a UV (ultraviolet) curing solution was used as the coating liquid with a view to making a protective film for a metalized surface.

Also, the disk diameter was 130 mm and the range of coating with the UV curing solution was a portion of and beyond a radius of about 20 mm.

Accordingly, in FIG. 1, values of $x_s = 20$ mm and $X_e = 65$ mm are determined.

The UV curing solution is a resin solution that will be cured and solidified by irradiation of ultraviolet rays. More specifically, an acrylic ester composition was used, having physical properties of a 23 cP viscosity, a 1.07 specific gravity, a 29 dyne/cm surface tension, and a 9.8% cure shrinkage.

Under such conditions, the amount of liquid required to form a protective film of a 5 μm film thickness was estimated as approximately 70 mg.

Therefore, since the amount of discharge liquid by the ink jet head is approximately 300 mg/min, a protective film of about 7 μm would be formed by completing the coating process in about 20 sec.

In this case, Equation (1) can be expressed as the following Equation (3):

$$v = 95.6/x \qquad \text{Equation (3)}$$

(where v is in mm/s and x is in mm).

Here is explained the way how the constant $k_1$ is determined.

Let us assume that, as described before, the coating is started at a position with radial distance x=20 (mm) from the origin O of the coating-object substrate 10, and terminated at a position of x=65 (mm), and that the coating time is 20 sec. The coating time is determined from the film thickness and the coating area. With these assumptions, Equation (1) can be transformed into $$(dx/dt)*x=k_1$$

Solving this differential equation yields $$(½)*x^2=k_1*t+C$$

where C is a constant.

If the coating start time is t=0 (sec), then x=20, so that $$(½)*20^2=C$$

C=200

If the coating end time is t=20 (sec), then x=65, so that $$(½)*65^2=k_1*20+C$$

Substituting the above C=200 into this equation yields $$k_1 = \{(1/2)*65^2 - 200\}/20$$
$$= 95.6$$

Thus, with the above assumptions, $k_1$ can be determined as 95.6.

Equation (2), on the other hand, relates to the thickness of lines and the number of times of overcoating (or line density) during the coating process. Therefore, three cases of $k_2$=32000, 36000, and 40000 (θ: rpm, x: mm) were discussed.

Actually, by using a personal computer, such a control operation was performed that the x-axis direction velocity v and the angular velocity θ would satisfy Equation (2) and Equation (3), respectively, through software.

More specifically, for the control of the velocity v according to Equation (3), it is convenient to represent v as a function of time.

That is, since v=dx/dt, Equation (3) can be transformed into the following relational Equation (4):

$$x*dx/dt=95.6 \qquad \text{Equation (4)}$$

Then, solving the differential equation shown by Equation (4) and substituting the condition of x=20 mm at t=0 allows x to be represented by the following Equation (5) so that v can be represented by the following Equation (6):

$$x=(191.2t+400)^{1/2} \qquad \text{Equation (5)}$$
$$v=95.6(191.2t+400)^{-½} \qquad \text{Equation (6)}$$

Therefore, v is controlled by the personal computer so as to satisfy Equation (6), under which condition the actual coating would be performed.

FIG. 5 is a view of a coating system using a personal computer according to the present embodiment.

In FIG. 5, where components similar to those of FIG. 1 are designated by like numerals, there are further shown a motor 51, a motor driver 52, a personal computer 53 serving as a control means, and a moving plate 54.

In this arrangement, the coating-object substrate 10 is driven into rotation by a motor 50, while the relative movement of the ink jet head 11 and the coating-object substrate 10 is implemented by the motor 51.

Also, the motors 50, 51 are controlled by the motor driver 52, which is connected to the personal computer 53 and drive-controlled by the software installed on the personal computer 53.

Figure 6:
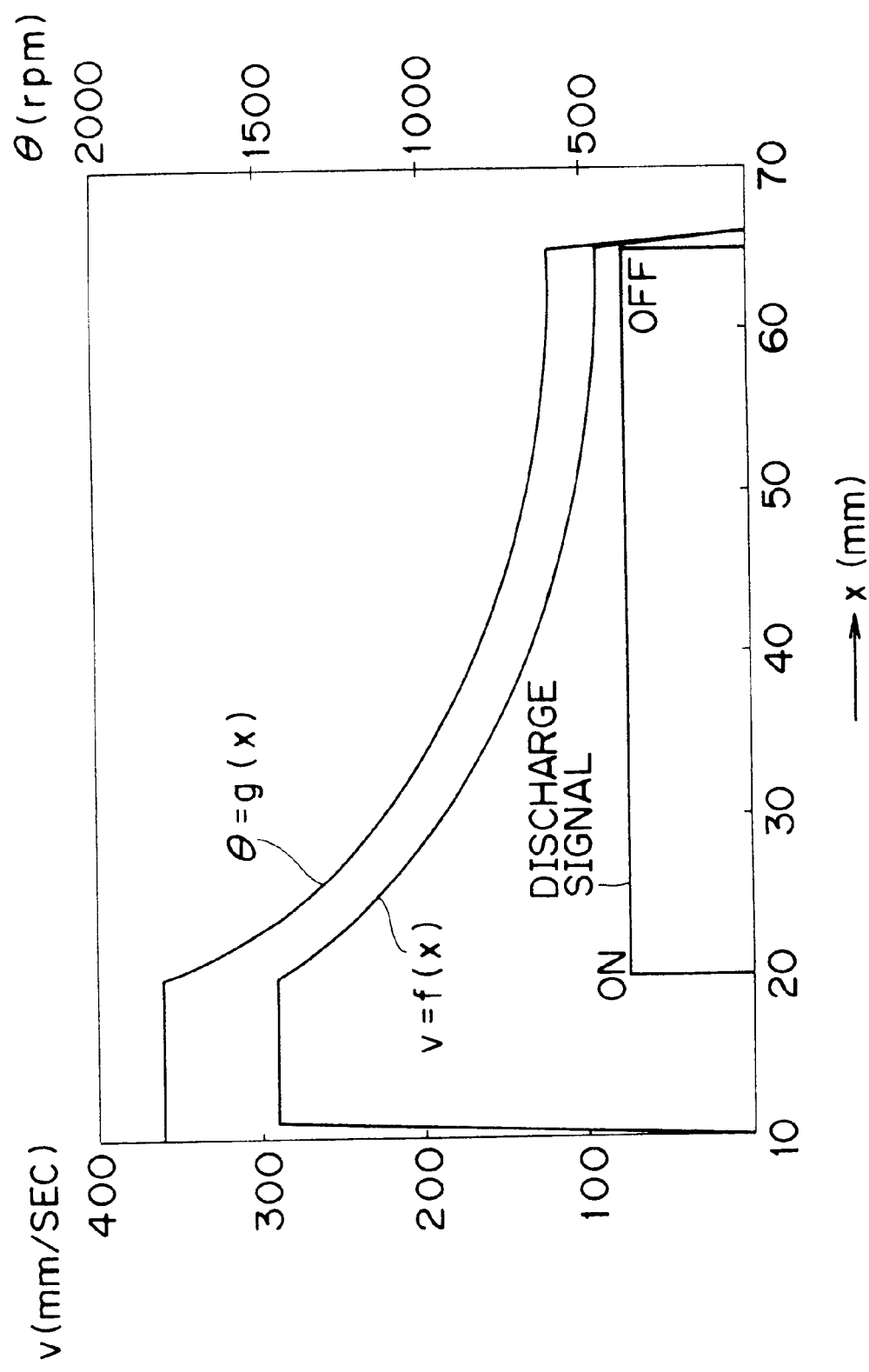
FIG. 6 is a graph illustrating the operation of the thin film forming apparatus.

FIG. 6 charts an example of the control of v, θ and a discharge signal.

Referring to FIG. 6, the abscissa axis represents a position x from the radial center of the optical disk, and the ordinate axis represents an x-direction velocity v of the ink jet head and a rotation speed θ of the disk.

First, in the initial state, the ink jet head is located at a position of x=10 mm, and the disk is rotating at 1800 rpm.

Next, when the ink jet head starts a relative movement at v=290 mm/s and reaches a position of x=20, then a discharge signal is inputted so that the coating liquid is discharged, while the ink jet head and the disk perform movement and rotation under decelerations with v and θ in inverse proportion to x as shown by the figure.

Then, a discharge stop signal is inputted when the position of x=65 is reached, where the velocity v and angular velocity θ are reduced to zeroes.

Measurement results under the above conditions are shown for three cases of $k_2$=32000, 36000, and 40000 (θ: rpm, x: mm).

First, under the condition of $k_2$=32000, because of a low number of revolutions and a low density of coating lines, there was a tendency that striped projections and depressions were formed.

Next, under the conditions of $k_2$=36000, a thin film with a smooth film thickness of 6 to 8 μm was able to be formed.

On the other hand, under the condition of $k_2$=40000, excessive centrifugal force was generated because of too high a number of revolutions, so that the coating liquid that had been deposited before was fluidized to flow outward during the coating process. As a result, there was a tendency that radial stripes were generated.

Accordingly, in this example, whereas the condition of $k_2$=36000 is preferable, those formed under other conditions are also applicable depending on the type of the thin film to be formed.

In addition, in order to form a thin film uniform over the entire range of the coating-object substrate and constant in thickness, it is preferable that both Equation (1) and Equation (2) are satisfied. However, there are some cases where only at least one of the two equations needs to be satisfied depending on the type of the thin film.

As described above, in the present embodiment, at least one or both of Equation (1) and Equation (2) are satisfied, that is, the relative velocity v is reduced increasingly in accordance with outwardly increasing distance from the center, that is, with outwardly moving from a nearby region of the substrate near the rotary axis of the spindle to a separate region of the substrate separate from the rotary axis, and/or the number of revolutions θ is also reduced with an increasing value of x. By this arrangement, a thin film that is uniform over the entire range of the coating-object substrate and constant in thickness is able to be formed.

(Embodiment 2)

Next, a second embodiment of the present invention is described in detail.

As has been described for the first embodiment, by properly setting $k_1$ and $k_2$ according to the conditions of Equation (1) and Equation (2) depending on the type or film thickness or the like of the thin film to be formed by coating process, it becomes possible to form a desired thin film. However, depending on the processes or others for the thin film to be formed, there are some cases where further investigations are required.

For example, in the case of $k_1=191.2$ in Equation (1), where the coating would be terminated in about 10 sec and a film thickness of about 3.5 µm could be formed, experiments were performed with $k_2$ of Equation (2) varied up to 60000. As a result, no smooth thin films were obtained but circumferential stripe patterns were left.

Such a phenomenon could be considered to take place, for example, when there are limitations in miniaturizing the discharge droplets of the coating liquid or when the number of revolutions of the spindle is too low.

In the present second embodiment, in view of cases where the thin film does not become enough uniform in film thickness only by the coating process with the ink jet head, there is provided an arrangement that allows the projections and depressions to be smoothly leveled.

Figure 7:
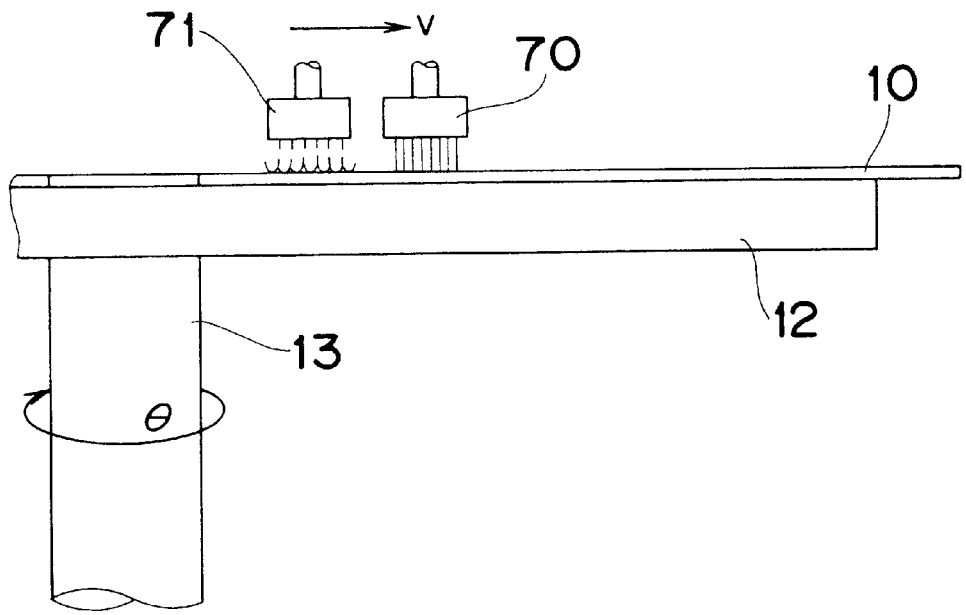
FIG. 7 is a view of a thin film forming apparatus according to a second embodiment of the present invention.

FIG. 7 is a schematic view of a spin coater in the second embodiment of the present invention.

In the same way as in the first embodiment, referring to FIG. 7, while the coating-object substrate 10 made of polycarbonate is kept rotating, a coating liquid discharge head 70, which is an ink jet head, is relatively moved, whereby a thin film is formed with a coating liquid of UV curing solution.

Moreover, in the present second embodiment, an air flow-out head 71 is further provided adjacent to the coating liquid discharge head 70. With this arrangement, an air flow is blown out just after the coating liquid has been deposited onto the coating-object substrate 10, causing the coating liquid to be fluidized, whereby the coating film can be smoothed.

More specifically, in the present second embodiment, with the use of the same ink jet head and coating liquid as in the first embodiment, discussions were made with the settings of $k_1=191.2$ in Equation (1) and $k_2=60000$ in Equation (2).

First, without the air flow-out head 71, stripe patterns were left such that a smooth coating layer was unable to be obtained.

In contrast to this, with the air flow-out head 71 added as in FIG. 7, a uniform 3 to 4 µm thin film was able to be formed.

More specifically, the air flow-out head 71 was so constructed that 24 nozzles of a 100 µm bore diameter were arrayed, and an air flow was blown out at a pressure of about 0.15 kg/cm$^3$. It could be considered that the outflow rate of air would be 100 to 200 m/s and that the air flow would be a flow of laminar flow region having less turbulence of air.

Figure 8:
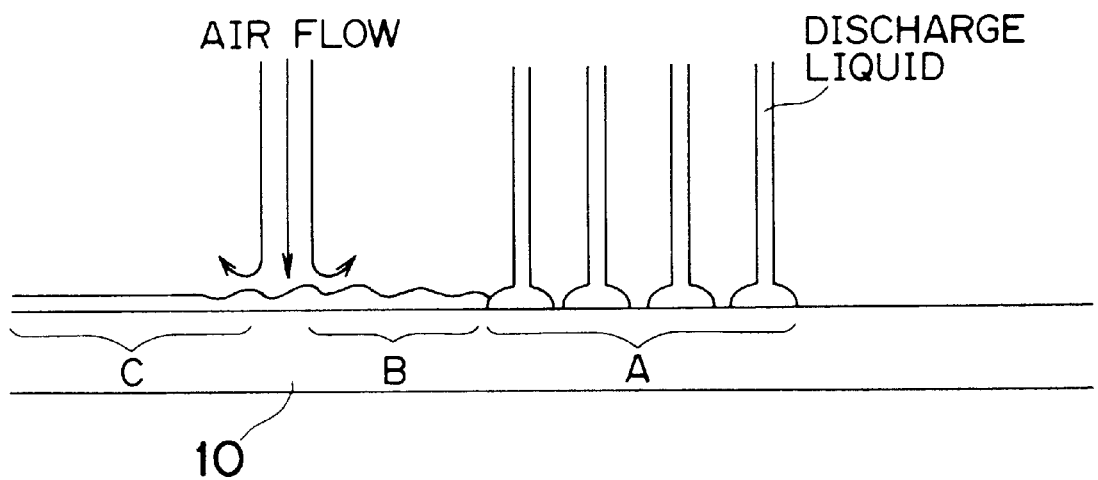
FIG. 8 is an explanatory view of the thin film forming apparatus of FIG. 7.

FIG. 8 depicts how the coating film is made uniform by air flow.

Referring to FIG. 8, first, immediately after the discharge liquid is deposited onto the coating-object substrate 10, adjacent lines are in a state as shown by a region A where they are separated from each other.

Thereafter, the coating liquid spreads to wet the substrate 10 with time, resulting in a state as shown by another region B. Without any measures, projections and depressions would not be solved but dried and cured.

If an air flow is blown against the coating liquid before the drying and curing of projections and depressions, the coating film of the region B in the projection-and-depression state is further fluidized so as to undergo fine vibrations. As a result, the film results in a uniform thin film as in a region C.

As described above, in the present second embodiment, an air flow-out head 71 is provided adjacent to the coating liquid discharge head 70. Then, by blowing out an air flow immediately after the deposition of the coating liquid onto the coating-object substrate 10 and before the drying and curing, the coating liquid is fluidized and vibrated so that a uniform coating film is able to be formed.
(Embodiment 3)

Figure 9:
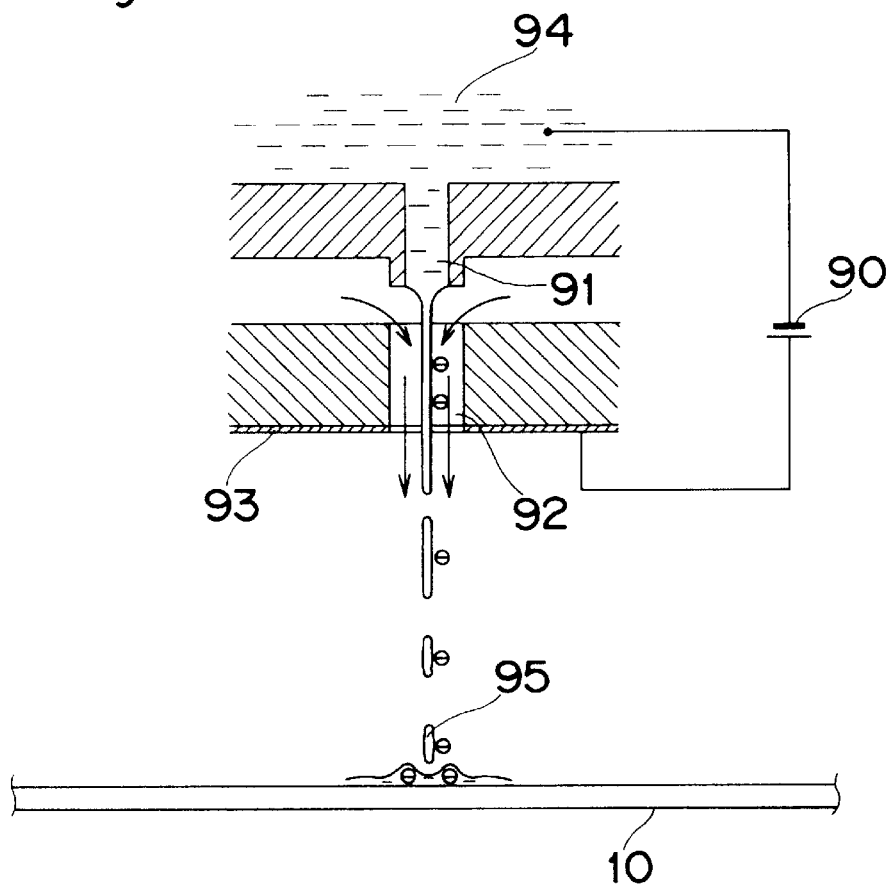
FIG. 9 is a cross sectional view of a thin film forming apparatus according to a third embodiment of the present invention.

Next, as show in FIG. 9, a third embodiment of the present invention is described in detail.

The present third embodiment is intended to improve the uniformity of the thin film formed in the same way as in the second embodiment. In this third embodiment, the discharge liquid is electrically charged to obtain the uniformity of thin films.

More specifically, an electrode 93 is provided on the surface of an air discharge port 92 of an ink jet head having the same basic construction as that of the first embodiment. A potential difference is developed by a power supply 90 between the electrode 93 and a discharge liquid 94 retained within a liquid discharge port 91 so that discharged droplets 95 are electrically charged. The coating-object substrate 10 and the discharge liquid 94 used in this embodiment are similar to those used in the first embodiment.

FIG. 9 is an enlarged view of the nozzle portion of the ink jet head of the present third embodiment.

Referring to FIG. 9, the liquid discharge port 91 and the air discharge port 92 are made of insulating materials, and the electrode 93 is provided on the exit side surface of the air discharge port 92.

Further, the power supply 90 is connected so that a potential difference is applied between the electrode 93 and the discharge liquid 94 retained at the liquid discharge port 91.

In such an arrangement, when a potential difference is applied by the power supply 90, the discharge liquid 94 is electrically charged according to the electrostatic capacity between the electrode 93 and the discharge liquid 94.

Then, the droplets 95 discharged outward are electrically charged and flown, reaching and depositing on the coating-object substrate 10.

The droplets 95 electrically charged in this way will keep electrically charged when they are deposited on a substrate made of an insulating material such as polycarbonate.

Then, the deposited portions at which the droplets 95 have previously been deposited on the coating-object substrate 10 and the droplets 95 that subsequently reach the coating-object substrate 10 have been electrically charged to the same polarity, so that they are repelled by each other. As a result, an effect is exerted in such a direction that the deposited liquid spreads wider on the coating-object substrate 10.

More specifically, in the present third embodiment, by using an optical disk made of polycarbonate and a UV curing solution, with settings of $k_1=191.2$ in Equation (1) and $k_2=60000$ in Equation (2), and with a potential difference of about 600 V developed between the electrode 93 and the discharge liquid 94, the coating process was carried out for 10 sec.

Then, when the liquid was not electrically charged, stripe patterns were left so that a smooth thin film was not formed. On the other hand, when the discharge liquid was electrically charged with the potential difference developed between the electrode 93 and the discharge liquid 94, a 3 to 4 µm smooth thin film was able to be formed.

As described above, in the present third embodiment, a uniform coating film is able to be formed by electrically charging the discharge liquid with a potential difference developed between an electrode, which is provided around the exit of the air discharge port, and the discharge liquid.

In addition, it is of course allowed that, in combination with the arrangement of the present third embodiment that the discharge liquid is electrically charged, the air flow-out head as described in the second embodiment is further provided so that an air flow is blown out immediately after the deposition of the coating liquid onto the coating-object substrate and before the drying and curing. By this combined arrangement, more uniform coating films can be formed with even higher reliability.

Also, in any of the above-described embodiments, the coating-object substrate and the type of the coating liquid are not limited to those exemplified above. The present invention may also be applied to resist coating onto a silicon substrate, and to the formation of functional thin films having electrical or optical functions on a glass substrate, ceramic substrate, metal substrate, or the like. However, the coating liquid is preferably a non-fast-drying resin solution with a view to preventing the nozzles from clogging during the coating process.

In the present invention, under the control of the angular velocity and the moving velocity, the coating-object substrate and the ink jet head are moved relative to each other between a region near the spindle and another region increasingly far from the spindle while they are kept rotating relative to each other. In this movement, the liquid is discharged through a plurality of nozzles of the ink jet head onto the coating-object substrate, whereby a coating film with good uniformity is formed on the coating-object substrate.

Further, when an air flow-out head is provided, the air flow is blown out to the coating-object substrate immediately after the liquid is discharged onto the coating-object substrate.

Furthermore, when an electrically charging means for electrically charging the liquid discharged from the ink jet head is provided, deposited portions of droplets that have previously been deposited on the coating-object substrate and droplets that subsequently reach the coating-object substrate are repelled by each other. As a result, the liquid moves in such a direction that the liquid deposited on the coating-object substrate spreads wider.

With the above-described arrangement, in the present invention, there is provided a thin film forming apparatus which can form a thin film uniform over the entire surface of the coating-object substrate without wasting the coating liquid or causing the outer peripheral portion of the film to be thickened, only with a very simple constitution.

There is also provided a thin film forming apparatus with a high degree of freedom, which makes it possible to form a thin film of a specified film thickness by varying the conditions in various ways according to the purpose.
(Embodiment 4)

Now described is a thin film forming method using a solution with resistivity not less than $10^5$ Ωcm as a fourth embodiment of the present invention.

Figure 10A:
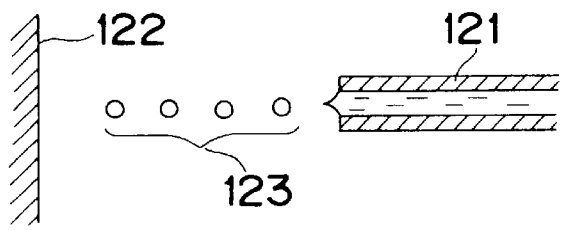
FIGS. 10A, 10B, and 10C are explanatory views for explaining the principle of discharge in a fourth embodiment of the present invention.
Figure 10B:
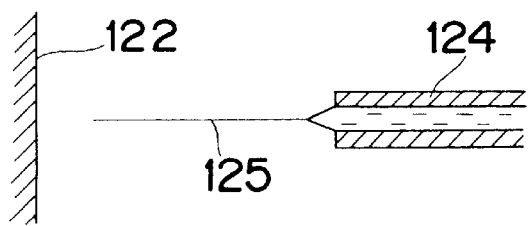
Figure 10C:
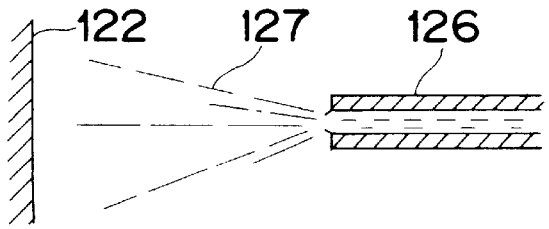

FIGS. 10A, 10B, and 10C are explanatory views showing the discharge state in the case where the solution is discharged by using electrostatic force.

In FIGS. 10A, 10B, and 10C, reference numerals 121, 124, 126 denote nozzles, 122 denotes a coating-object member, and 123 through 127 denote solution discharge states.

When the solution is discharged by using electrostatic force, the state of discharge could be classified roughly into such states as shown in FIGS. 10A, 10B, and 10C.

That is, as the typical three states of discharge, FIG. 10A is a state in which the solution is discharged in the form of droplets 123 independent of the nozzle 121 so as to be deposited on the coating-object member 122; FIG. 10B is a state in which the solution is discharged with the occurrence of a stringing phenomenon as if a string denoted by 125 is drawn from the nozzle 124, so as to be deposited on the coating-object member 122; and FIG. 10C is a state in which the solution is discharged in a spray state denoted by 127 from the nozzle 126 so as to be deposited on the coating-object member 122.

For the formation of fine thin films, there is a demand that the solution be discharged in such a state that the stringing phenomenon of FIG. 10B is developed. Through the experiments by the inventors of the present invention, it has been found that the state of discharge is dependent on the resistivity of the solution. That is, if the resistivity is lower than $10^5$ Ωcm, the electrostatic force will not successfully act on the solution so that good stringing could not be attained. Thus, the resistivity of the solution is preferably not less than $10^5$ Ωcm.

The details of the experiments are explained below.

Figure 11:
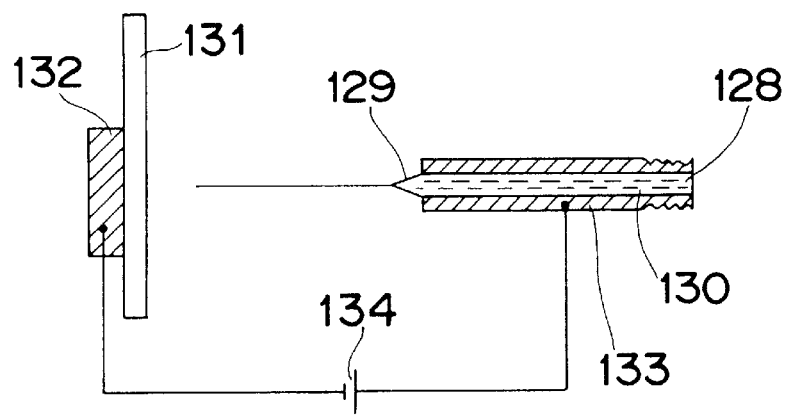
FIG. 11 is a view of an arrangement for solution discharge, which embodies the same principle of discharge.

FIG. 11 is a view showing the fundamental arrangement for the solution to be discharged by electrostatic force and thereby coated.

In FIG. 11, there are shown a solution supply port 128, a solution discharge port 129, a solution 130, a coating-object member 131 on which a thin film is formed by the deposited solution, a rear electrode 132 provided on the rear surface of the coating-object member 131, a nozzle 133, and a high-voltage power supply 134.

In this arrangement, the solution 130 is discharged from the nozzle 133 toward the coating-object member 131 by an electric field generated by applying a voltage between the rear electrode 132 and the nozzle 133 with the high-voltage power supply 134.

Figure 12:
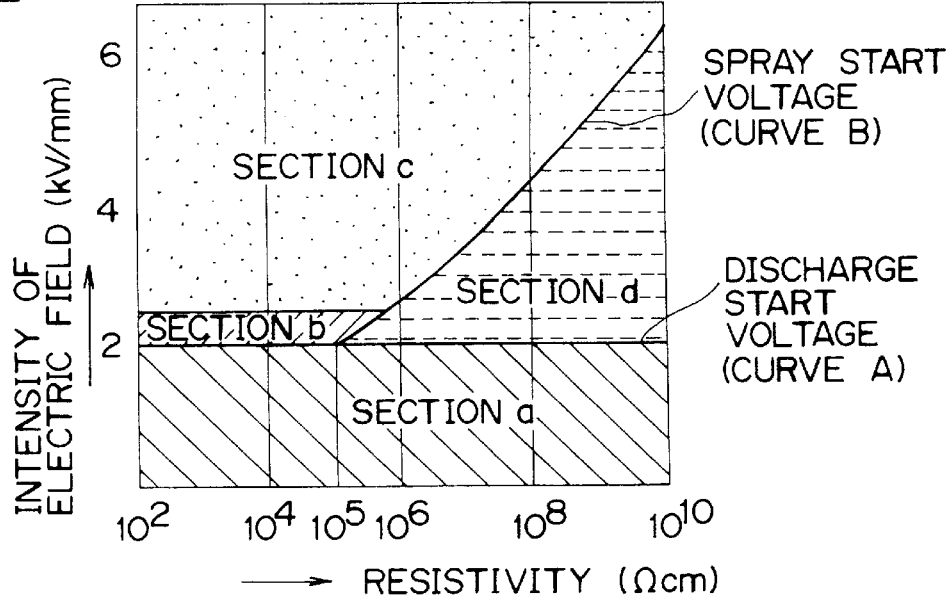
FIG. 12 is a characteristic chart of solution discharge that depends on the resistivity-electric field relationship obtained with the arrangement which embodies the same principle of discharge.

FIG. 12 charts the state of discharge of the solution in terms of the relationship between resistivity and applied voltage in the case where the solution is discharged by utilizing electrostatic force with the arrangement as shown in FIG. 11.

In FIG. 12, the abscissa axis represents the resistivity of the solution, and the ordinate axis represents the intensity of electric field due to electrostatic force, where the section a shows a state that the solution is not discharged, the section b shows a state that the solution is discharged in the form of independent droplets (FIG. 10A state), the section c shows a state that the solution is discharged in a spray state (FIG. 10C state), and the section d shows a state that the solution is discharged in a stringing state (FIG. 10B state).

As described before, in order to form a thin film of fine pattern, it is necessary to discharge the solution in such a stringing state that the discharge solution can be controlled.

Accordingly, in order that the state of the section d in FIG. 12 is attained, it is a first precondition that a solution having a resistivity of not less than $10^5$ Ωcm be selected. Further, adjusting the energy (intensity of electric field) imparted to the solution to such a level that a stringing state is attained offers a discharge state that allows successful thin film formation.

For example, MOD (Metallo-Organic Deposition) solutions that are under development as materials of DRAM-use capacitors and non-volatile memories, sol-gel solutions, and the like generally have hydrocarbon-based organic solvents, such as ethanol and methanol, added thereto as a solvent, and the resistivity of those solutions is generally not less than $10^7$ Ωcm.

If these solutions are discharged by the conventional discharge method using a piezoelectric element, there would occur cavitation such that successful solution discharge could not be accomplished. However, if those solutions are discharged with the arrangement of the present embodiment, the solution discharge can be accomplished in a stable stringing state by virtue of the solutions' high resistivity above $10^5$ Ωcm as apparent from FIG. 12. Therefore, a piezoelectric thin film or dielectric thin film can be formed directly at an arbitrary place of the substrate without using exposure process or etching process.

Figure 13:
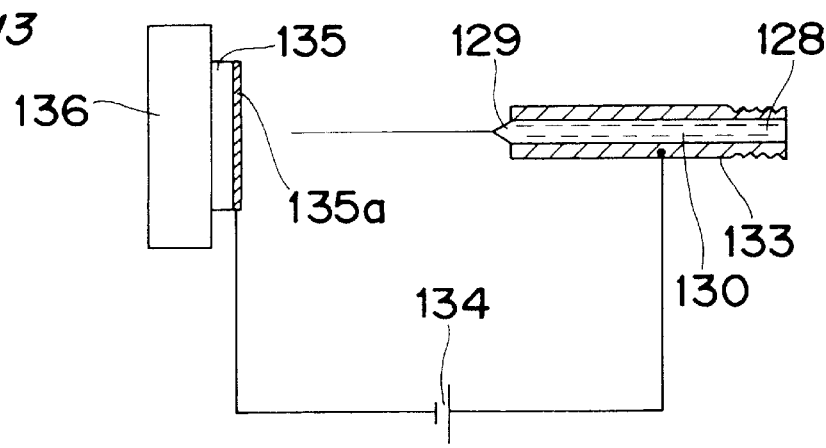
FIG. 13 is a view of another arrangement for solution discharge, which embodies the same principle of discharge.

The case is the same also when the solution is discharged, not with the arrangement of FIG. 11, but with an arrangement as shown in FIG. 13.

This arrangement is similar to that of FIG. 11 in the principle of discharging the solution with electrostatic force, but differs therefrom in that a metal film 135a formed on top of a coating-object member 135 is utilized as one electrode for generating an electric field. Either of those arrangements may be selected depending on the application.

Next described in detail is a thin film forming apparatus to which the above-described thin film forming method is actually applied.

Figure 14:
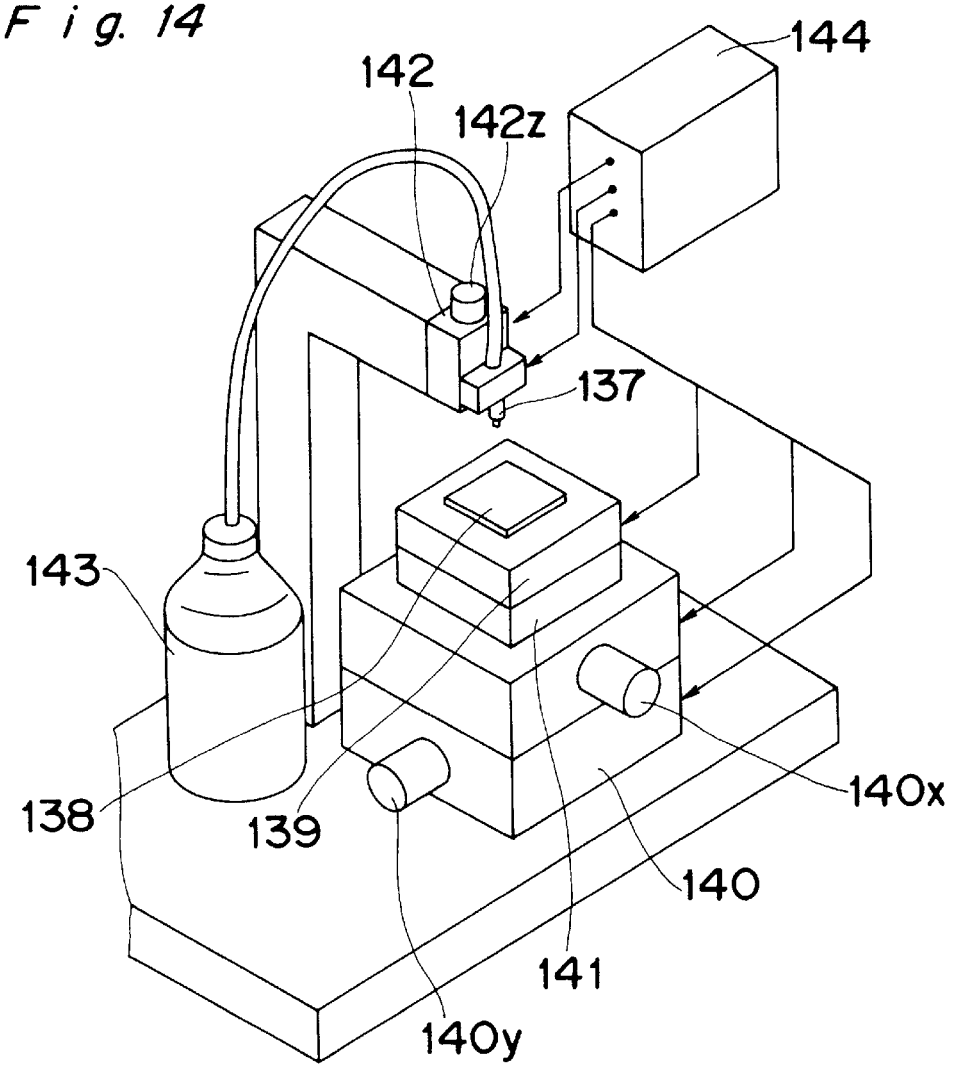
FIG. 14 is an overall arrangement view of a thin film forming apparatus, which embodies the same principle of discharge.

FIG. 14 shows the arrangement of the thin film forming apparatus according to the fourth embodiment of the present invention.

In FIG. 14, there are shown a solution discharge part 137 for discharging the solution, a coating-object member 138 on which a thin film is formed by the solution being discharged, a heater block 139 for heating the coating-object member 138, an X-Y stage 140 which has a motor 140x for moving the coating-object member 138 in the X-direction and a motor 140y for moving it in the Y-direction perpendicular to the X-direction, and which causes the coating-object member 138 to move so that the solution is discharged to an arbitrary place on the coating-object member 138, whereby a thin film is formed, a heat-insulating plate 141 arranged for preventing the conduction of heat generated from the heater block 139, a Z stage 142 which has a motor 142z that can move the solution discharge part 137 in the Z-direction, which is perpendicular to the X- and Y-directions, and which enables the solution discharge part 137 to be positioned in the vertical direction, and a solution feed part 143 which stores the solution to be discharged and feeds the solution to the solution discharge part 137.

Further shown is a control part 144 which serves as the solution discharge amount control of the solution discharge part 137, the temperature control of the heater block 139, and the travel control of the X-Y stage 140 and the Z stage 142.

With such an apparatus, after the positioning of the solution discharge part 137 is done by the Z stage 142, the solution is discharged from the solution discharge part 137 toward the coating-object member 138 according to the aforementioned principle of discharge. In this process, the X-Y stage 140 is moved during the course of discharge or after the completion of discharge, as required.

Then, since the heater block 139, a heating mechanism for heating the coating-object member 138, is provided, a thin film can be formed by heating the coating-object member 138 to thereby rapidly evaporate the solvent after the solution is discharged onto the coating-object member 138. Thus, the time required to form a thin film can be reduced.

In addition, similar advantages can be obtained also by adopting a method in which a lamp is used as the heating means, or other like methods.

Of course, the heating process may be omitted if drying under room temperature is sufficient in terms of time.

Also, the film formation can be accomplished by similar processes even if the substrate has a curved surface or the like without being limited to a flat plate.

Furthermore, by adding a function of filling inert gas as the atmosphere of the field where a thin film is formed, to the apparatus as shown in FIG. 14, it becomes possible for the solution to maintain its characteristics without being affected by the air even if the solution to be discharged is such as would react with the moisture or the like in the air so as to deteriorate in its characteristics.

As the means for filling inert gas as the atmosphere of the field where the thin film is formed, for example, it may be arranged that the field where the thin film is formed is enclosed by a container, where inert gas is introduced with a pressure higher than the air, or that a vacuum pump or the like is used to develop a pressure difference between the field where the thin film is formed and the air so that the field where the thin film is formed is filled with inert gas.

Further, the head of the solution discharge part 137 for discharging the solution may also be arranged to be a multi-nozzle head with a plurality of nozzles. This makes it possible to accomplish the thin film formation with different solutions at the same time, or to fabricate a plurality of circuit patterns with regular intervals at the same time. Thus, it becomes feasible to improve the productivity.

(Embodiment 5)

Now a fifth embodiment of the present invention is described.

Whereas a solution with high resistivity (not less than $10^5$ Ωcm) has been mentioned in the fourth embodiment, the fifth embodiment is described on a case where solutions with low resistivities (less than $10^5$ Ωcm) are discharged.

Some of the sol-gel solutions commercially available, such as $SrTiO_3$ sol-gel solutions containing acetic acid as the primary solvent, have a resistivity as low as about $4 \times 10^3$ Ωcm. On this account, the stringing phenomenon would not be developed by electrostatic force, such that a stable solution discharge cannot be attained by the discharge according to the principle of the fourth embodiment.

This could be attributed to the fact that acetate forms ions dissociated in the solvent, causing the resistivity to lower.

Therefore, with a view to increasing the resistivity, isobutyl benzene, which is a hydrophobic organic solvent, was mixed into the solution as a second solvent at a ratio of 1:1. Then, as included in the section d in FIG. 12, the resistivity increased to $10^7$ Ωcm so that a successful solution discharge could be attained.

As seen above, by using a second solvent intended for resistivity adjustment in addition to a first solvent that well dissolves the medium, it becomes possible to prepare a solution that can be successfully discharged by electrostatic force.

Generally, this second solution is preferably an organic solvent which is lower in polarity than the first solution and which is well compatible with the first solution. Preferable therefor are organic solvents exemplified by aliphatic hydrocarbons, naphthenic hydrocarbons, and aromatic hydrocarbons such as mono- or di-alkyl naphthalene and phenethyl cumene.

Then, by the same after-discharge processes as in the fourth embodiment, thin film formation can be accomplished.

(Embodiment 6)

Now a sixth embodiment of the present invention is described.

In the present sixth embodiment, the discharge of a solution, especially resin solution, with relatively high viscosity (10 to 20 cP or more) is described.

The method of forming a thin film by discharging a solution having a resin dissolved therein onto the coating-object member and thereafter drying the solution to thereby obtain a resin thin film could be applied to mask materials for fabricating electronic component circuits and other various applications.

Since these solutions are generally high in viscosity as much as 10 to 20 cP or more, they would often be unable or unstable to discharge if the conventional piezoelectric discharge method is used.

However, it has been found that using the discharge method with electrostatic force allows high precision patterns to be fabricated even with a viscosity of 20 to 30 cP if the solution is a resin solution.

It is noted that some resin solutions have resistivities lower than $10^5$ Ωcm.

Referring to FIG. 12, it might be considered to be impossible to discharge those resin solutions of low resistivity. However, according to the discussions by the present inventors upon the resin solutions, it has been found that a stringing state can be created even with low resistivity, exceptionally.

For example, the resistivity of a PVA (polyvinyl alcohol) aqueous solution in which PVA is added to 5% is about 500 Ωcm. It was established that this solution was able to be discharged in a stringing state by the discharge method with electrostatic force.

This could be attributed to the fact that not only the value of resistivity but also the magnitude of molecular weight of the solute itself in some cases must be taken into consideration as the factors of physical property values that cause a stringing phenomenon to be developed by electrostatic force.

Although the reason has not been clarified for the fact that resin solutions are more likely to develop a stringing phenomenon, it is considered that high polymer resins are more likely to develop a stringing phenomenon as high polymer protein will draw a string.

Then, by the same after-discharge processes as in the fourth embodiment, thin film formation can be accomplished.

Through the above processes, when a resin is used as the discharge solution, a thin film can be formed over a substantially expanded range of permissible resistivities. Therefore, whereas the mask formation in fabricating electronic component circuits generally involves a plurality of processes such as coating of resin, exposure, and etching, it becomes possible to form the mask only by one process if the thin film is formed from a resin solution according to the principle of discharge of the fourth embodiment. Thus, great effects can be produced in reducing the number of processes involved in circuit fabrication, lowering the prices of circuits, and the like.

(Embodiment 7)

Now a seventh embodiment of the present invention is described.

In the present seventh embodiment, a method of forming a metal thin film is described.

If a thin film can be formed by discharging a solution containing metal fine powder directly onto a coating-object member, it becomes possible to fabricate fine interconnections directly. Thus, great effects can be produced in downsizing the circuits and lowering the prices.

The solution containing metal fine powder stable may be prepared by using a dispersant and suspending it.

An example of the dispersant is the surface active agent, which will be adsorbed to the solid-liquid interface to reduce and stabilize the interface energy.

That is, since the surface active agent forms an adsorption protective coating film on the surface of fine particles, there will not occur direct contact or collision among individual fine particles in a suspension liquid in which the surface active agent has been stably dispersed. Therefore, the solution may be low in electrical conductivity, i.e., of a resistivity not less than $10^5$ Ωcm.

Further, the adsorption protective film can be formed only with a surface active agent, but there also exist substances that strengthen the surface coating film.

Those substances are generally referred to as protective colloids or emulsion stabilizers. Adding such a substance makes it possible to positively avoid collisions among the fine powder particles and to prepare a suspension liquid stable in electrical characteristics.

As protective colloids, there are known natural rubber, starch, alginates, protein, lecithin, ether with fiber, polyvinyl alcohol, polyvinyl pyrrolidone, polyacrylate derivatives, colloidal silica, and the like.

Generally, dispersants of fine particles are called colloids when the size of their fine particles is not more than 0.1 μm, and emulsions when the size of their fine particles is in the range of a several μm to 0.1 μm.

Such fine particle dispersants are already commercially available. In the present embodiment, an independently dispersed ultra-fine particle solution containing 30 wt % of Ag, in which silver fine particles made by Shinku Yakin K.K. were dispersed in a toluene solvent, was used.

The dispersed fine particles, generated by an evaporation process in the gas environment, has a particle size of not more than 0.1 μm, wherein individual particles dispersed in a colloidal state are dispersed independently without agglomerating. Thus, the resistivity of the solution is as high as about $10^7$ Ωcm.

When the dispersant of these fine particles was discharged onto the coating-object member with electrostatic force, the discharge was able to be attained with occurrence of a successful stringing phenomenon.

Thereafter, when the dispersant discharged onto the coating-object member was heated at 300° C., the dispersant was formed into a silver thin film having electrical conductivity.

This could be attributed to the fact that the surface active agent or protective colloid that had covered the silver fine particles was fused and evaporated by heat, forming contact agglomerates among the silver fine particles.

Of course, as described before, this heating process may be omitted depending on the circumstances.

As seen above, even if the fine particles themselves have a property of low resistivity, forming a discharge solution by making fine particles coated with an insulating material allows the thin film formation to be accomplished with a successful discharge by electrostatic force, and direct fine interconnections to be accomplished. Thus, great effects can be produced in price reduction of circuits or wiring onto the coating-object member having a curved surface.

(Embodiment 8)

Now an eighth embodiment of the present invention is described.

The fourth to seventh embodiments have been described in a case where only electrostatic force is used as the means for discharging the solution. On the other hand, the present eighth embodiment is described on a case where vibrations due to the piezoelectric element or the like are auxiliarily applied to the solution in addition to the electrostatic force.

Figure 15:
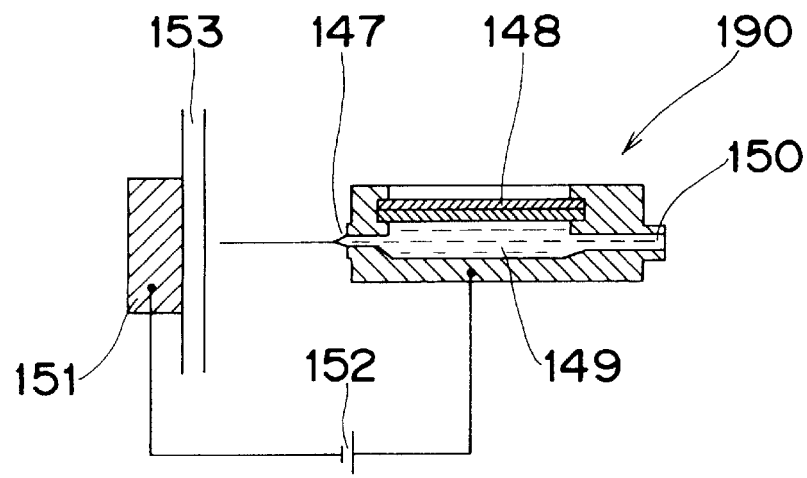
FIG. 15 is a view of another arrangement according to an eighth embodiment of the present invention for solution discharge, which embodies the same principle of discharge.

FIG. 15 shows the arrangement for discharging the solution with a nozzle 190 using electrostatic force and pressure wave in combination.

In FIG. 15, there are shown a discharge port 147, a piezoelectric element 148 for generating a pressure wave to the solution, a pressure chamber 149, a solution feed part 150, a rear electrode 151, a high-voltage power supply 152, and a coating-object member 153.

With this arrangement, when a voltage is applied to the piezoelectric element 148, the piezoelectric element 148 distorts so that the volume of the pressure chamber 149 varies.

This volume variation of the pressure chamber 149 causes the solution within the discharge port 147 to be fluidized. Then, the solution, if fluidized to an extent larger than a specified value, will be formed into droplets so as to be discharged toward the coating-object member 153.

Besides, there is an electric field acting between the ink in the pressure chamber 149 and the rear electrode 151, exerting a force that attracts the ink toward the coating-object member 153.

The solution discharge is effected when an electrostatic force is applied to the solution, or when both the pressure wave due to the piezoelectric element 148 and the electrostatic force are present. With no force applied to the solution, the solution is retained at the discharge port 147 by the surface tension of the solution.

Figure 16:
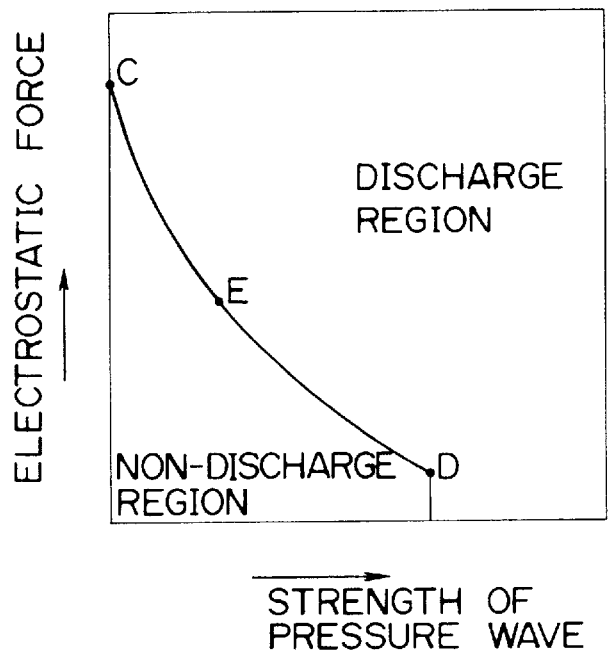
FIG. 16 is a characteristic chart of solution discharge that depends on the pressure wave-electrostatic force relationship obtained with the arrangement of FIG. 15.

FIG. 16 shows the results of the solution discharge effected with only electrostatic force and with both electrostatic force and pressure wave in combination, by the use of the above-described apparatus.

The curve shown in FIG. 16 is a result of interconnecting solution discharge start points. The curve shows that whereas an electrostatic force of the point C (equivalent to 2 kV/mm, the intensity of electric field of FIG. 12) is required when no pressure wave due to the piezoelectric effect is imparted to the solution, the electrostatic force can be made relatively smaller as the pressure wave increases, until the point D is reached, by adding the pressure wave to the solution.

In this case, although varying depending on the material and size of the piezoelectric element, the configuration of the liquid chamber, the diameter of the nozzle, the physical property values of the discharge liquid, and the like, the magnitude of the pressure wave imparted to the solution is generally around 50 V to 500 V as the value of voltage to be applied to the piezoelectric element.

This experimental result shows that the discharge start voltage as shown in FIG. 12 in the fourth embodiment may be lowered by auxiliarily adding pressure wave to electrostatic force so that the stringing phenomenon can be developed over a wider area, as compared with the solution discharge method in which only electrostatic force is applied to the solution.

The aforementioned fact is further explained with reference to FIG. 17.

Figure 17:
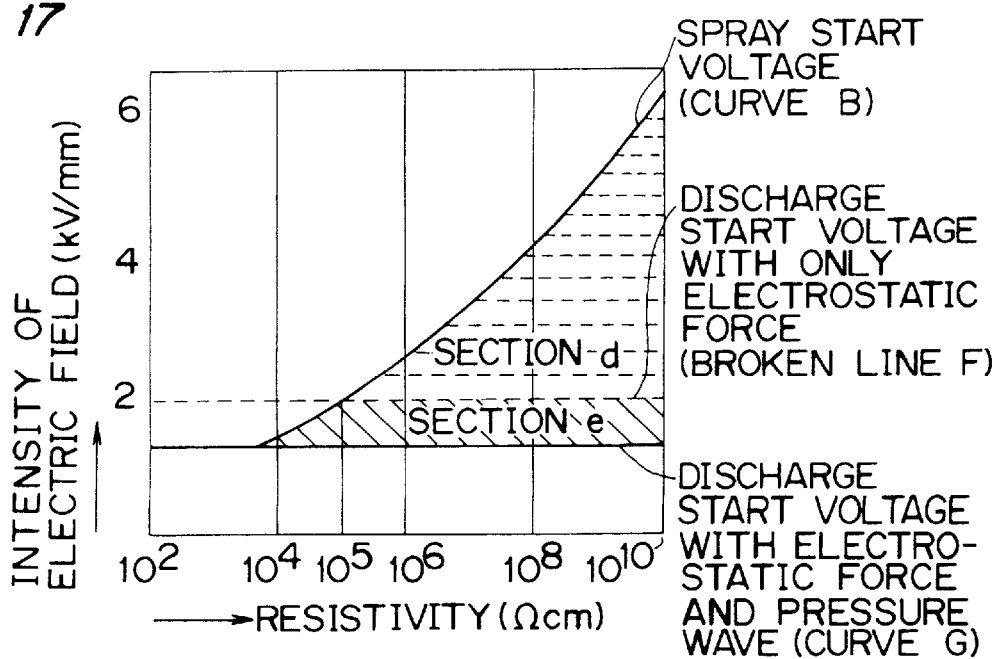
FIG. 17 is a characteristic chart of solution discharge that depends on the resistivity-electric field relationship obtained with the arrangement of FIG. 15.

FIG. 17 charts a relationship between the resistivity value of the solution and the applied voltage at discharge start on a condition that the electrostatic force and pressure wave shown by the point E of FIG. 16 are applied to the solution.

Referring to FIG. 17, the broken line F indicates the discharge start voltage with only electrostatic force (corresponding to the curve A of FIG. 12), while the curve G indicates the discharge start voltage with electrostatic force and pressure wave.

Adding pressure wave to electrostatic force as the discharge means causes the discharge start voltage of the solution to lower. Therefore, as the area where the solution yields a stringing phenomenon, the section e can be added to the section d, which would be the resulting area with only electrostatic force. This makes it possible to use solutions with low resistivities, so that the discharge solution can be selected from a wider selection range.

Then, by the same after-discharge processes as in the fourth embodiment, thin film formation can be accomplished.

As seen above, adding pressure wave as well as electrostatic force to the discharge solution allows the discharge solution to be selected from a wider variety of types than in the solution discharge method with only electrostatic force. Thus, it becomes possible to form a wider range of types of thin films, producing great effects in fabricating circuit components or micromachines.

The foregoing fourth to eighth embodiments have been described in a case where the solution is used in such a manner as to be discharged into a stringing state. However, the present invention is not limited to this. The resistivity of the solution may be adjusted so that the solution can be formed into droplets as shown in FIG. 10A, or into a spray state as shown in FIG. 10C, when coating in such a state is desired.

With the above-described arrangement of the present invention, the type of solution that can be used for discharge is subject to substantially no restrictions.

Further, when the discharge solution can be formed into a stringing state with reliability, fine thin films can be formed.

As described above, according to the present invention, by using a solution-state substance as the film forming material, and with electrostatic force solely or a piezoelectric effect in addition to electrostatic force utilized as the means of discharging the film forming material, the solution of the film forming material is discharged onto a film-forming object member and then evaporated by heating the solvent contained in the solution or by allowing the solution to stand for a specified time under room temperature. Thus, the type of solution that may be used for discharge is subject to substantially no restrictions, as compared with the conventional film forming method, and moreover, when the discharge solution is arranged to be formed into a stringing state, fine thin films can be formed. As a result, great conveniences can be offered in fabricating various types of circuits and devices.

Otherwise, the ink jet head may be so constructed that a differential pressure is outwardly applied from the liquid supply source side to a meniscus formed at the liquid discharge nozzle, whereby the liquid is discharged. In this case, it may also be arranged that an air discharge nozzle is provided opposite to the liquid discharge nozzle so that an air flow is blown outward through a clearance between the liquid discharge nozzle and the air discharge nozzle, wherein an air pressure of the liquid discharge nozzle on a side near the air discharge nozzle is set smaller than the air pressure applied from the liquid supply source side to the meniscus formed at the liquid discharge nozzle in order that the liquid will override on the air flow so as to be discharged outward.
(Embodiment 9)

Now a ninth embodiment of the present invention is described.

Figure 18:
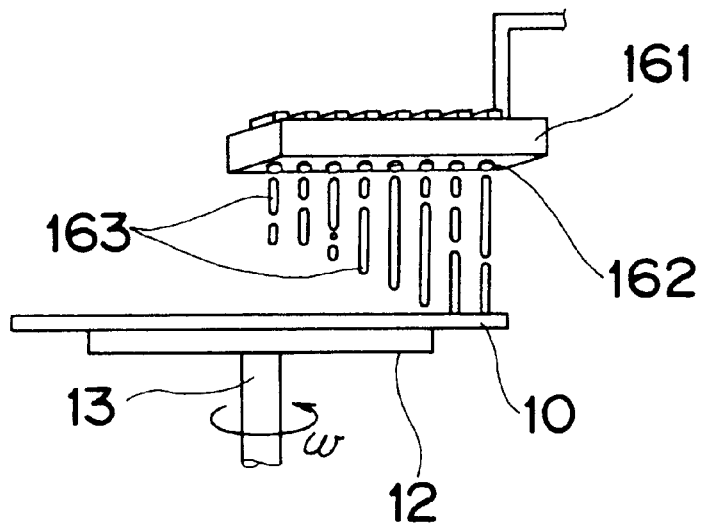
FIG. 18 is a schematic arrangement view of a spin coater used for a thin film forming method according to a ninth embodiment of the present invention.

FIG. 18 is a schematic arrangement view of a spin coater to be used for an apparatus and method for forming thin films according to the ninth embodiment of the present invention.

In FIG. 18, there are shown a coating-object substrate 10, an ink jet head 161, and a nozzle 162.

It is noted here that the ink jet head 161 refers to the type where the liquid is discharged through a micro-nozzle (generally, not more than 0.1 mm) so as to be deposited onto a recording medium under the control of the liquid discharge state with an electrical signal.

Also, the nozzle 162 is provided in a plurality and arrayed radially of the rotating coating-object substrate 10 at regular intervals.

With such an arrangement, the processes of forming a thin film are described below.

First, for example, when the similar driving control mechanism to FIG. 5 is used, by control of the personal computer 53 of FIG. 5, while the coating-object substrate 10 is kept rotating at low speed, coating liquid 163 is discharged toward the coating-object substrate 10 from the nozzles 162 of the ink jet head 161, whereby the coating liquid 163 is started to be deposited onto the coating-object substrate 10.

Then, while the coating-object substrate 10 is kept rotating at low speed until the coating liquid 163 is deposited onto the generally entire surface of the coating-object substrate 10, the coating liquid 163 is continued to be discharged toward the coating-object substrate 10 from the nozzles 162 of the ink jet head 161. Accordingly, this low-speed rotation is required only to meet a number of revolutions sufficient for the coating liquid to be deposited onto the surface of the coating-object substrate 10.

In this case, if the pitch between the plurality of nozzles 162 is so wide that lines of the coating liquid 163 formed by adjacent nozzles 162 will not overlap but separate from each other, the coating-object substrate 10 is rotated to a plurality of turns at low speed while the ink jet head 161 is moved radially of the coating-object substrate 10, whereby the coating liquid is deposited over the entire surface of the coating-object substrate 10 without clearances, by the personal computer 53 of FIG. 5.

Subsequently, by control of the personal computer 53 of FIG. 5, after checking that the coating liquid has been deposited over the generally entire surface of the coating-object substrate 10, the coating-object substrate 10 is rotated at a speed rotation, which is higher than the foregoing low speed rotation so that coating liquid that has been excessively coated is spattered away while the coating film is further improved in uniformity. In this way, a thin film is formed on the coating-object substrate 10.

Discharge nozzles conventionally used for spin coaters are those having an inside diameter of 0.5 to 1 mm such that they are difficult to control for a minute discharge amount. Using the ink jet head 161 as in the present ninth embodiment, on the other hand, allows fine patterns to be drawn, and a uniform, extremely thin film to be formed.

Furthermore, according to the ninth embodiment, since the entire surface of the coating-object substrate 10 is previously coated with the coating liquid by the ink jet head 161, the coating liquid to be spattered away during the high speed rotation can be reduced to a small amount, contributing to a reduction in the running cost as well as to a large reduction in the processing time.

(Embodiment 10)

Now a tenth embodiment of the present invention is described.

Figure 19:
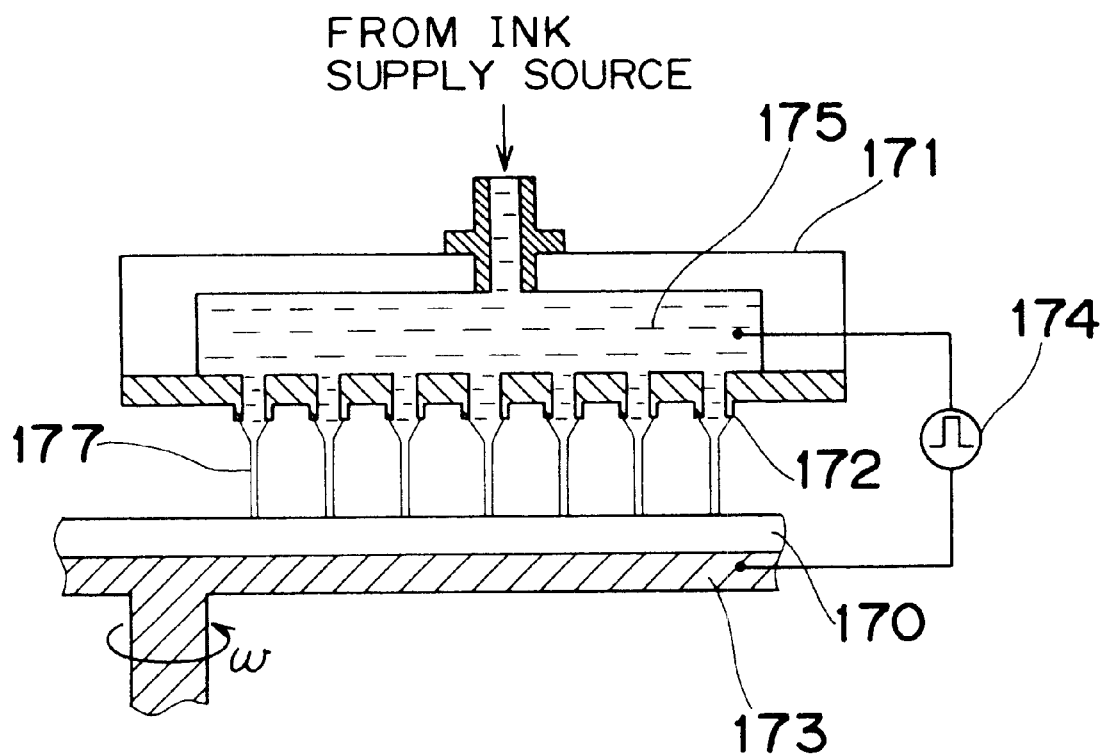
FIG. 19 is a sectional view showing an ink jet head of a thin film forming method according to a tenth embodiment of the present invention.
Figure 20A:
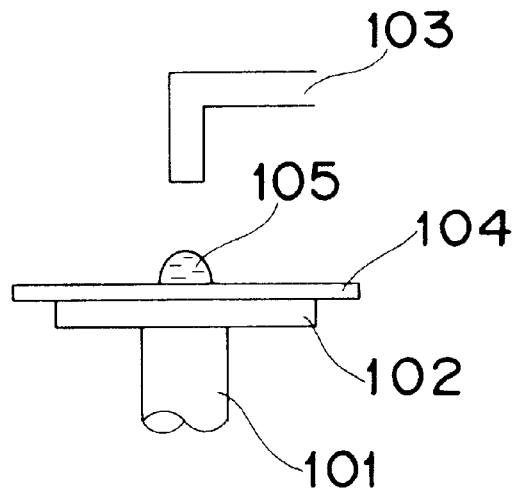
FIGS. 20A, 20B, and 20C are explanatory views of a conventional thin film forming apparatus.
Figure 20B:
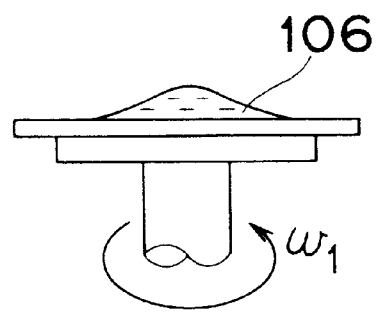
Figure 20C:
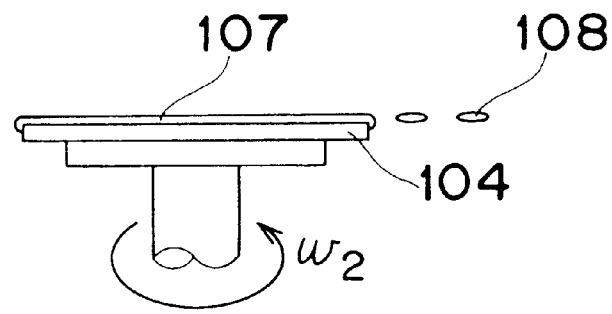
Figure 21:
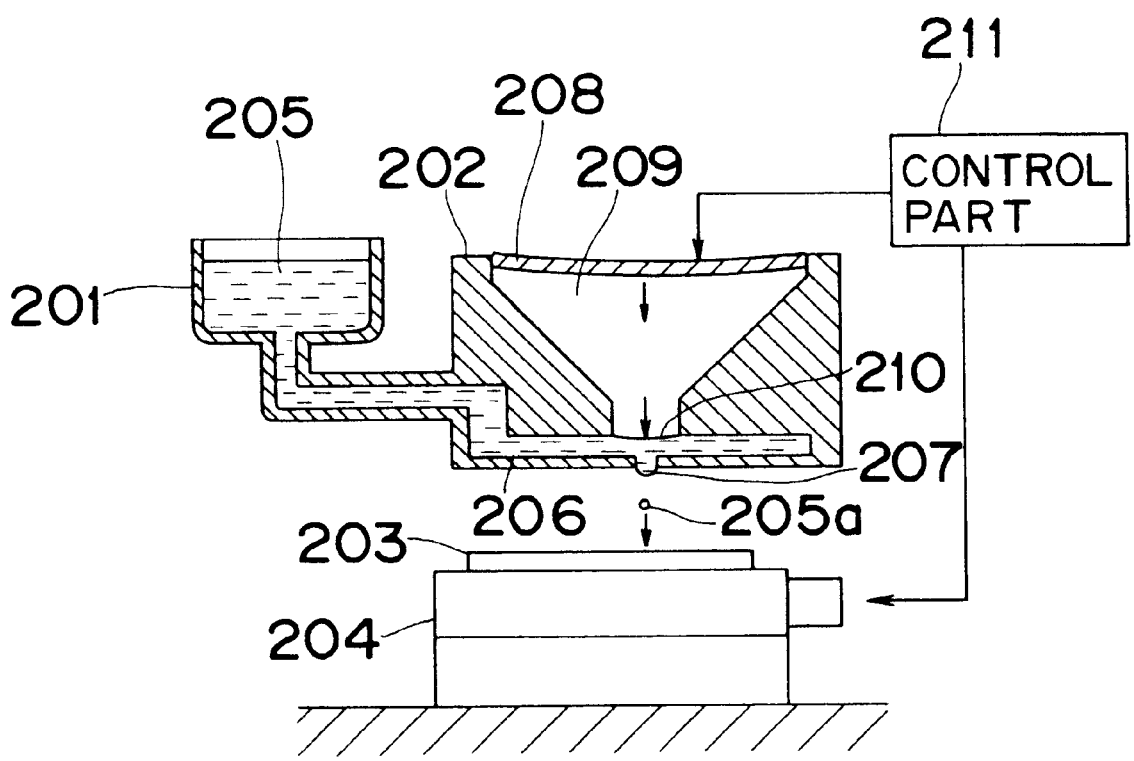
FIG. 21 is an explanatory view of the conventional thin film forming method.

FIG. 19 is a main-part sectional view of a spin coater, showing an example of the detailed construction of the ink jet head to be used for the thin film forming method according to the tenth embodiment of the present invention.

Generally, various types of systems are available as the ink jet recording system, including the bubble jet system in which air bubbles are generated by thermal energy and the liquid is discharged by the resultant pressure, and the piezoelectric type on-demand system in which a liquid chamber is compressed by a piezoelectric element and the liquid is discharged by the resultant pressure wave. These systems, however, are largely limited in the liquid that can be discharged; for example, the viscosity is limited to as small as 1 to 5 cP as usable liquids.

Using an ink jet head of an arrangement called the electrostatic attraction system as shown in FIG. 19 makes it possible to discharge liquids of relatively high viscosities (about 100 cP or less).

In FIG. 19, there are shown a coating-object substrate 170, an ink jet head 171 of the electrostatic attraction system, discharge nozzles 172, and a substrate fixing base 173 which is made of an electrically conductive substance such as a metal and which serves also as an electrode.

Further shown are a high-voltage generator 174 and a liquid chamber 175.

The spin coater having such an arrangement is described in its operation below, whereas the operation of thin film formation itself is similar to that of the ninth embodiment in principle.

First, while the coating-object substrate 170 is rotated at low speed, a high-voltage pulse is applied between the substrate fixing base 173 and the liquid chamber 175 for a specified time period by the high-voltage generator 174.

While this high-voltage pulse is applied, the meniscuses of the liquid formed at the discharge nozzles 172 are attracted toward the substrate fixing base 173 so as to be discharged, and thus the liquid is deposited on the coating-object substrate 170.

In general, if the distance between the discharge nozzles 172 and the substrate fixing base 173 is 2 to 3 mm, then the liquid can be discharged at a voltage of around 2 to 4 kV.

For such an ink jet head of the electrostatic attraction system, solutions of organic solvents with not more than about 100 cP and high insulating property are applicable, and therefore polyimide liquids and resist liquids or the like can be discharged.

Subsequently, after checking that the coating liquid 177 has been deposited over the generally entire surface of the coating-object substrate 170, the coating-object substrate 170 is put into higher speed rotation than the previous low speed rotation so that coating liquid that has been excessively coated is spattered away while the coating film is further improved in uniformity. In this way, a thin film is formed on the coating-object substrate 170.

Also in the present tenth embodiment, finer patterns than by the conventional spin coaters can be drawn while a uniform, very thin film can be formed.

Furthermore, since the entire surface of the coating-object substrate 170 is previously coated with the coating liquid 177 by the ink jet head 171 using electrostatic force, the coating liquid to be spattered away during the high speed rotation can be saved, contributing to a reduction in the running cost as well as to a large reduction in the processing time. As the above ink jet head, the ink jet head of the first embodiment as shown in FIGS. 2 to 4 may also be used.

In addition, if the ink jet head used in the ninth and tenth embodiments is controlled by the solenoid valve 41 of FIG. 4, the ink jet head has no problem in practical use when the objective is to form a uniform thin film, as in the present invention, without the need of drawing fine patterns, although the ink jet head is inferior in high-speed response.

Further, the system of the ninth and tenth embodiments, which is of a simple pressure control type, is less affected by the physical property values of the liquid such as viscosity, surface tension, and resistivity so that the degree of freedom for applicable liquids is large as a further advantage.

Also, in the ninth and tenth embodiments, the coating-object substrate has been positioned horizontal with the vertical axis taken as the axis of rotation, where the liquid is discharged from above. However, the present invention is of course not limited to such an arrangement only if a thin film having desired properties can be formed resultantly.

As seen above, according to the present invention, after the coating liquid is deposited over the generally entire surface of the substrate while the ink jet head having a plurality of micro-nozzles and the substrate are rotated relative to each other at relatively low speed, the substrate is relatively rotated at higher speed, whereby a uniform coating thin film is obtained. Thus, since the liquid to be spattered away and wasted can be suppressed to a minimum, a thin film forming method that involves low running cost and yet that is capable of high speed processing can be provided.

Furthermore, by using the ink jet head, it becomes possible to draw fine patterns as well as to form a more uniform, very thin film.

In this case, if an ink jet head of the electrostatic attraction system is used, solutions of organic solvents with not more than about 100 cP and high insulating property can be applied so that polyimide liquid, resist liquid, and the like may be discharged.

Also, if an ink jet head using air flow is used, the system is less affected by the physical property values of the liquid such as viscosity, surface tension, and resistivity so that the degree of freedom for applicable liquids is large as a further advantage.

(Embodiment 11)

Figure 22:
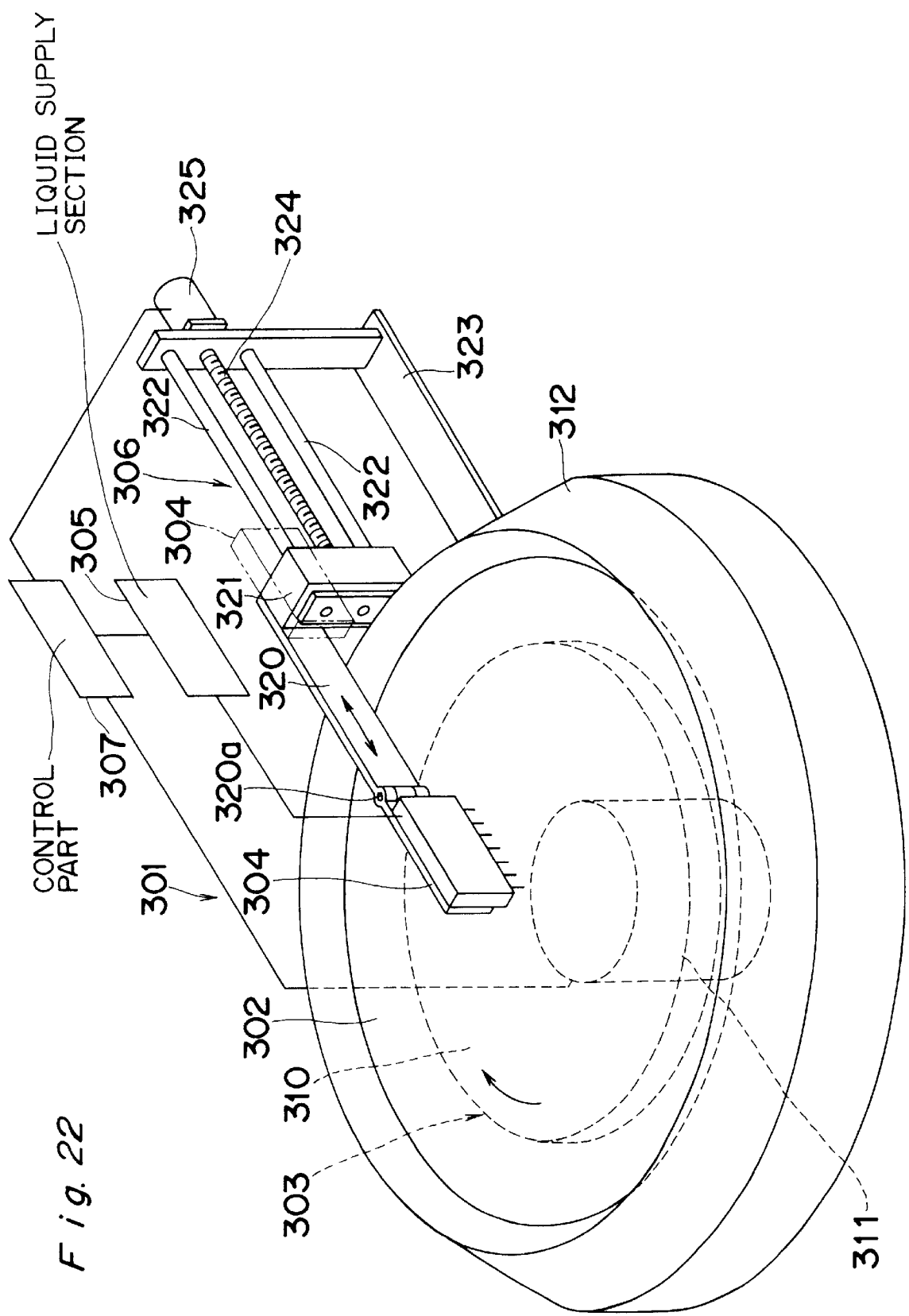
FIG. 22 is a perspective view of a film forming apparatus according to an eleventh embodiment of the present invention.

FIG. 22 is a perspective view showing a film forming apparatus 301 according to an eleventh embodiment of the present invention.

Referring to FIG. 22, the film forming apparatus 301 comprises a substrate holding section 303 for suctionally holding an optical disk substrate (hereinafter, referred to as substrate) 302 rotatable, a discharge head 304 for discharging a coating liquid toward the substrate 302 held by the substrate holding section 303, a liquid supply section 305 for supplying the liquid to the discharge head 304, a head moving part 306 for moving the discharge head 304 radially from the central to the peripheral side of the substrate 302, and a control part 307 for controlling the substrate holding section 303, the liquid supply section 305, and the head moving section 306.

The substrate holding section 303 has a substrate holding base 310, which is disc shaped and rotatable and serves to suck up the substrate 302, and a substrate rotating motor 311 for rotating the substrate holding base 310. A cup 312 to cover the periphery of the held substrate 302 is provided so as to surround the substrate holding section 303.

Figure 23:
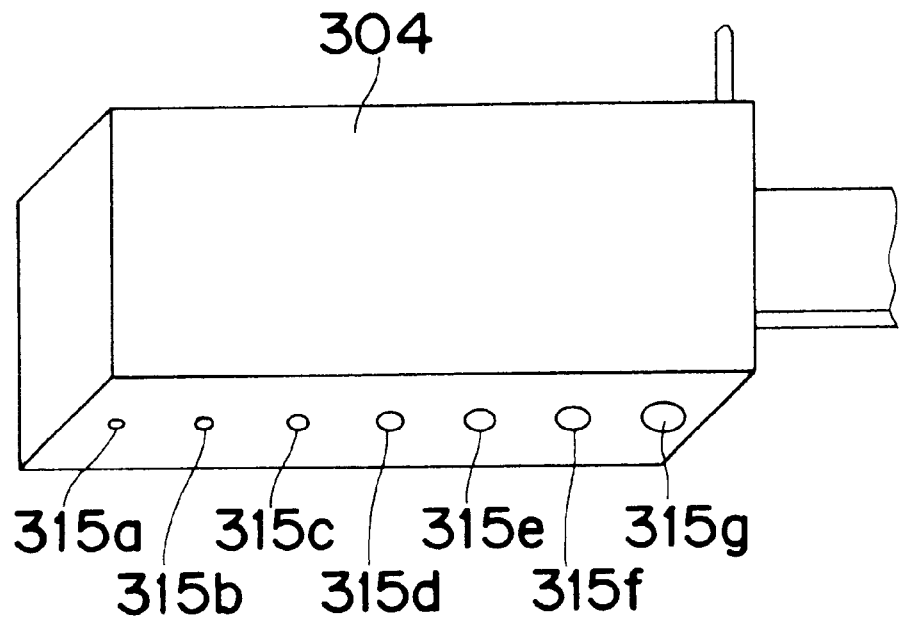
FIG. 23 is a perspective view of a discharge head of the film forming apparatus shown in FIG. 22.

The discharge head 304, as shown in FIG. 23, has, for example, seven nozzles 315a to 315g of the ink jet head type with their diameter increasing gradually. The bore diameters of these nozzles 315a to 315g are determined according to the coating area that increases on the peripheral side. The nozzles 315a to 315g are arrayed in a row in one direction. The nozzles may be arrayed in either a direction which is the radial direction of the nozzles or another which intersects the radial direction at a specified angle. In addition, since the coating area is larger on the peripheral side than on the central side of the substrate 302, the nozzle 315a of the minimum diameter is disposed on the central side of the substrate 302, while the nozzle 351g of the maximum diameter is disposed on the peripheral side.

The liquid supply section 305 is constructed by, for example, a quantitative discharge pump adjustable in its discharge amount, or a pressurized sealed tank. The liquid supply section 305 supplies the discharge head 304 with a constant discharge amount of liquid predetermined according to the coating area, processing time, and the film thickness.

The head moving section 306 moves the discharge head 304 between a start position as depicted by solid line in FIG. 22 and a retreat position as depicted by two-dot chain line, radially of the substrate 302. The head moving section 306 comprises an arm 320 with the discharge head 304 attached at its tip, a moving frame 321, a pair of upper and lower guide bars 322, a holding frame 323, a screw shaft 324, and a motor for movement 325. The arm 320 has midway a pivot 320a for adjusting the mounting position of the discharge head 304 about the vertical axis. The moving frame 321 is attached to a base end of the arm 320. The pair of upper and lower guide bars 322 guide the moving frame 321 horizontally. The holding frame 323 holds both ends of the guide bars 322 and rotatably supports the screw shaft 324. The screw shaft 324 is arranged between and in parallel to the guide bars 322, and has the moving motor 325 connected to its one end. Guide bearings (not shown), slidably supported by the guide bars 322, are installed within the moving frame 321.

The control part 307, as shown in FIG. 24, comprises a microcomputer containing CPU, ROM, RAM, and the like. Connected to the control part 307 are the liquid supply section 305, the substrate rotating motor 311, the motor for movement 325, and other input-output part. Further connected to the control part 307 are input keys 330 including a start key for starting the operation, and various sensors 331 including sensors for detecting the rotational position of the screw shaft 324 and the number of revolutions of the substrate drive section 311.

Figure 25:
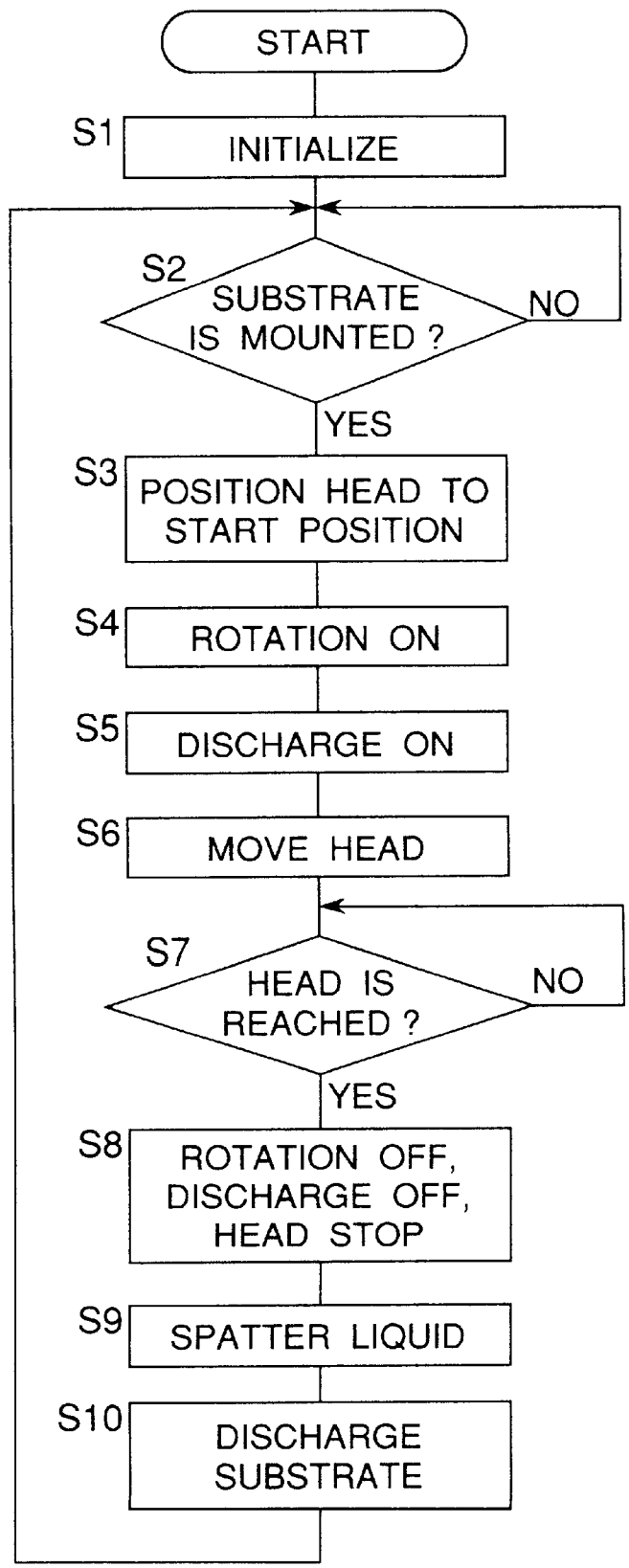
FIG. 25 is a control flow chart of the film forming apparatus shown in FIG. 22.

Next, the operation of the aforementioned embodiment is described according to the flow chart as shown in FIG. 25.

At step S1 in FIG. 25, the initial setting is performed. For this initial setting, the head moving section 306 brings the discharge head 304 to the retreat position as depicted by two-dot chain line. At step S2, the substrate 302 is mounted on the substrate holding base 310. When the substrate 302 is mounted on the substrate holding base 310, the program flow moves to step S3. At step S3, the discharge head 304 is brought to the start position as depicted by the solid line in FIG. 22 by the head moving section 306. At step S4, the substrate rotating motor 311 is turned on, so that the substrate 302 is rotated at a constant rotation speed. At step S5, the liquid supply section 305 is turned on, so that the liquid is discharged from the discharge head 304 toward the substrate 302. Then, at step S6, the discharge head 304 is moved at a constant speed toward the peripheral side of the substrate 302. At step S7, the discharge head 304 approaches the coating end position. When the discharge head 304 has reached the coating end position, the program flow moves to step S8. At step S8, the substrate rotating motor 311, the motor for movement 325, and the liquid supply section 305 are turned off. At step S9, the substrate rotating motor 311 is rotated at a high rotation speed, so that excess liquid is spattered away. At step S10, a substrate discharge command is transmitted to a separately provided substrate transfer system, where the program flows returns to step S2.

In this case, the nozzle diameters of the nozzles 315a to 315g are so arranged to increase with increasing coating area. Accordingly, a film of the most uniform possible film thickness can be formed through such simple control of rotating the substrate 302 at a constant speed and moving the discharge head 304 at a constant speed.

According to the eleventh embodiment, the ink jet head has a plurality of discharge parts which are constructed by the nozzles and are arrayed in one direction in such a way that the discharge amount of the liquid gradually increases toward the one direction, where a discharge part of a minimum discharge amount is disposed on a side of the nearby region of the substrate. Therefore, the discharge amount of liquid discharged from the discharge parts gradually increases as the movement progresses from the nearby region side (central side) to the separate region side (peripheral side) of the substrate. Thus, the discharge amount becomes larger on the peripheral side of the substrate where the coating area is large, so that the most uniform possible film thickness can be attained by simple control. Moreover, when the ink jet head is relatively moved to the substrate, a thin film can be formed even if the substrate is larger than the length of the liquid discharge section in its one direction. Furthermore, the discharge amount can be easily increased as the movement progresses toward the peripheral side of the substrate only by gradually increasing the bore diameter of the nozzles.

[Other Embodiments]

Figure 26:
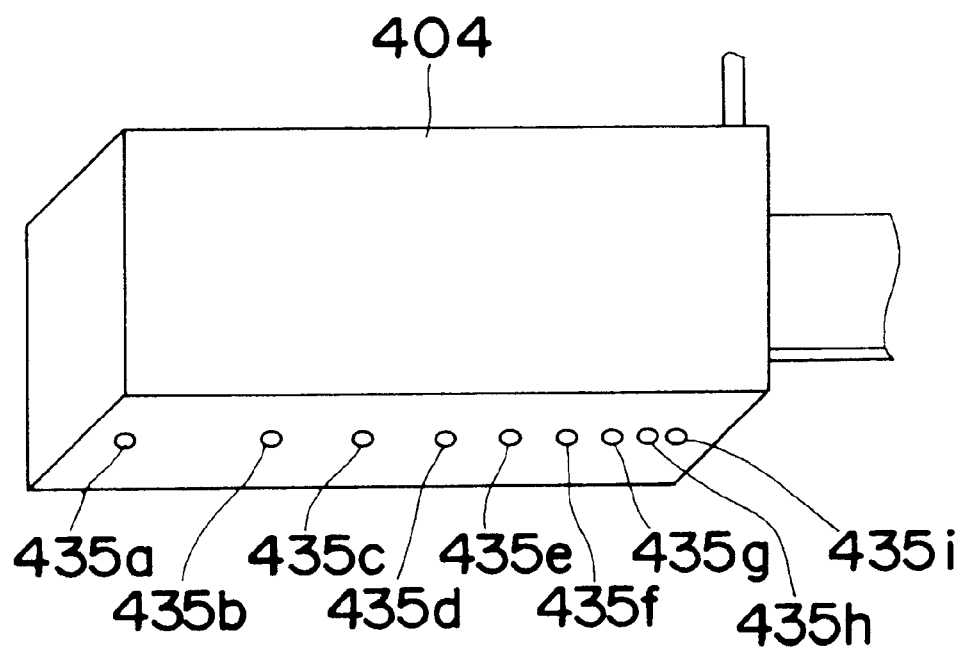
FIG. 26 is a view of another embodiment corresponding to FIG. 23.

(a) As shown in FIG. 26, in a discharge head 404, for example, nine nozzles 435*a* to 435*i* of the same diameter may be arrayed at intervals gradually narrowing with increasing coating area.

In this case, the discharge amount can be easily increased as the movement progresses toward the peripheral side of the substrate only by gradually narrowing the array pitch of the nozzles.

Figure 27:
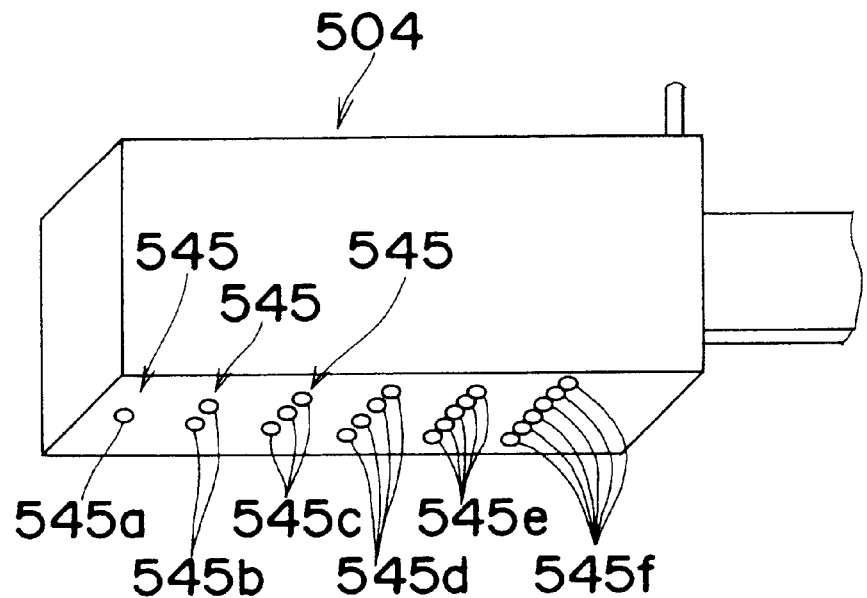
FIG. 27 is a view of another embodiment corresponding to FIG. 23.

(b) As shown in FIG. 27, in a discharge head 504, nozzle groups of, for example, six sets of the same diameter may be arranged at equal intervals, and the number of nozzles of nozzle groups 545*a* to 545*f* may be increased with increasing coating area. In this case, the nozzles may be arrayed in such directions as to intersect the direction in which the nozzle groups are arrayed, or otherwise the nozzles may be in circumferential configuration.

In this case, the discharge amount can be easily increased as the movement progresses toward the peripheral side of the substrate only by gradually increasing the number of nozzles of each nozzle group.

Figure 28:
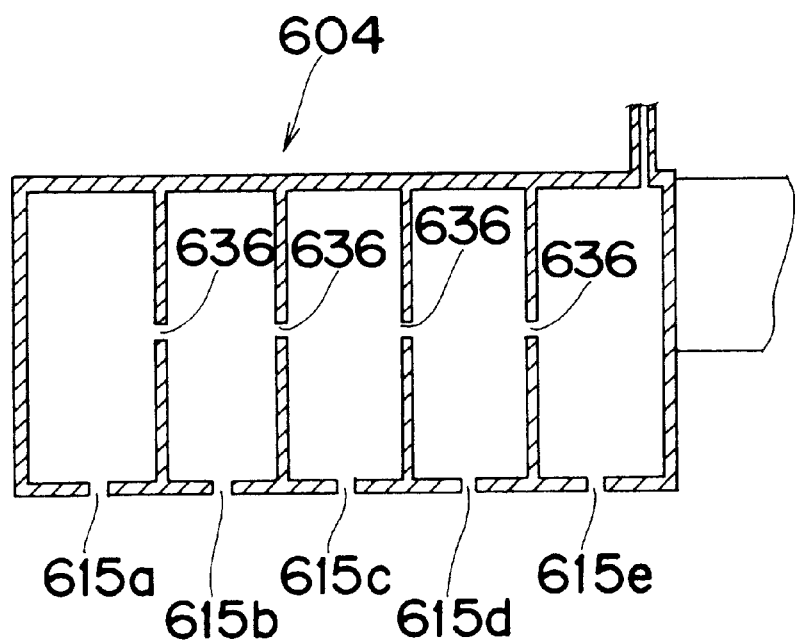
FIG. 28 is a view of another embodiment corresponding to FIG. 23.

(c) As shown in FIG. 28, in a discharge head 604, nozzles 615*a* to 615*e* may be arranged at equal intervals, and thin-edge orifices 636 for controlling the flow rate by gradually reducing the pressure of the liquid to be supplied to the nozzles 615*a* to 615*e* may be arranged in the discharge head 604.

In this case, thin-edge orifices 636 serving as a flow rate control member controls the discharge amount of the nozzles so that the discharge amount gradually increases toward the peripheral side of the substrate. Therefore, the discharge amount can be increased toward the peripheral side of the substrate by simple control.

(d) Instead of moving the discharge head, the substrate holding section may be moved.

As described above, according to the present invention, the discharge amount of liquid discharged from the discharge section gradually increases as the movement progresses from the central to the peripheral side of the substrate. Thus, the discharge amount becomes larger on the peripheral side where the coating area is larger, so that the film thickness can be made uniform as much as possible by simple control.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An apparatus for forming a film on a substrate, said apparatus comprising:

a rotating device for supporting and rotating the substrate about a rotary axis;

an ink jet head having a plurality of liquid discharge nozzles disposed so as to confront the substrate supported on said rotating device;

a moving device for moving one of said ink jet head and said rotating device relative to the other of said ink jet head and said rotating device in such a manner that said ink jet head is moved relative to said rotating device and the substrate, when mounted thereon, in an approximately radial direction of said rotating device between a first region of the substrate near said rotary axis and an outer periphery of the substrate;

a control device for controlling said moving device and said rotating device such that a moving speed of said ink jet head or the rotary speed of the substrate decreases as said ink jet head moves from the center to the outer periphery of the substrate, wherein said control device controls said moving device such that an angular velocity of rotation effected by said rotating device is reduced as a position of said ink jet head relative to said rotating device changes from said first region of the substrate to said outer periphery of the substrate; and an air flow head provided adjacent to said ink jet head and functioning to emit an air flow toward the substrate mounted on said rotating device, wherein the discharged liquid is enveloped in the air flow so as to be passed through air discharge ports in said air flow head and discharged outwardly thereof.

2. An apparatus for forming a film on a substrate, said apparatus comprising:

a rotating device for supporting and rotating the substrate about a rotary axis;

an ink jet head having a plurality of liquid discharge nozzles disposed so as to confront the substrate supported on said rotating device, wherein each of said nozzles comprises a liquid discharge port, and an air discharge port aligned with said liquid discharge port, wherein air can be discharged through said air discharge port to vary a pressure balance between a liquid pressure in said liquid discharge port and an air pressure in a vicinity of said liquid discharge port so as to discharge the liquid;

an electrode member provided about a periphery of each of said plurality of air discharge ports;

a potential difference applying device for applying a potential difference between said electrode member and any liquid within said liquid discharge port such that liquid discharged from said ink jet head is electrically charged;

a moving device for moving one of said ink jet head and said rotating device relative to the other of said ink jet head and said rotating device in such a manner that said ink jet head is moved relative to said rotating device and the substrate, when mounted thereon, in an approximately radial direction of said rotating device between a first region of the substrate near said rotary axis and an outer periphery of the substrate; and a control device for controlling said moving device and said rotating device such that a moving speed of said ink jet head or the rotary speed of the substrate decreases as said ink jet head moves from the center to the outer periphery of the substrate, wherein said control device controls said moving device such that an angular velocity of rotation effected by said rotating device is reduced as a position of said ink jet head relative to said rotating device changes from said first region of the substrate to said outer periphery of the substrate.

3. The apparatus as claimed in claim 2, wherein the liquid has a resistivity of not less than $10^5$ Ωcm.

4. An apparatus for forming a film on a substrate, said apparatus comprising:

a rotating device for supporting and rotating the substrate about a rotary axis;

an ink jet head having a plurality of liquid discharge nozzles disposed so as to confront the substrate supported on said rotating device;

a moving device for moving one of said ink jet head and said rotating device relative to the other of said ink jet head and said rotating device in such a manner that said ink jet head is moved relative to said rotating device and the substrate, when mounted thereon, in an approximately radial direction of said rotating device between a first region of the substrate near said rotary axis and an outer periphery of the substrate;

a control device for controlling said moving device and said rotating device such that a moving speed of said ink jet head or the rotary speed of the substrate decreases as said ink jet head moves from the center to the outer periphery of the substrate, wherein said control device controls said moving device such that an angular velocity of rotation effected by said rotating device is reduced as a position of said ink jet head relative to said rotating device changes from said first region of the substrate to said outer periphery of the substrate;

a supply of liquid including a solution-state substance containing a film forming material and a solvent for dissolving said film forming material;

a stage provided on said rotating device for receiving the substrate thereon; and a heater connected to said stage so as to heat the substrate when mounted on said stage.

5. The apparatus as claimed in claim 4, further comprising:

a first moving means for moving said ink jet head in a first direction, which is perpendicular to a substrate supporting surface of said stage; and a second moving means, disposed on said stage, for moving said stage in two perpendicular directions with a plane, which is perpendicular to said first direction.

6. An apparatus for forming a film on a substrate, said apparatus comprising:

a rotating device for supporting and rotating the substrate about a rotary axis;

an ink jet head having a plurality of liquid discharge nozzles disposed so as to confront the substrate supported on said rotating device, wherein said ink jet head comprises an electrostatic attraction ink jet head which attracts liquid outwardly of said nozzles by an electrostatic force;

a moving device for moving one of said ink jet head and said rotating device relative to the other of said ink jet head and said rotating device in such a manner that said ink jet head is moved relative to said rotating device and the substrate, when mounted thereon, in an approximately radial direction of said rotating device between a first region of the substrate near said rotary axis and an outer periphery of the substrate; and a control device for controlling said moving device and said rotating device such that a moving speed of said ink jet head or the rotary speed of the substrate decreases as said ink jet head moves from the center to the outer periphery of the substrate, wherein said control device controls said moving device such that an angular velocity of rotation effected by said rotating device is reduced as a position of said ink jet head relative to said rotating device changes from said first region of the substrate to said outer periphery of the substrate.

* * * * *